US012660578B2

(12) United States Patent
Ko et al.

(10) Patent No.: US 12,660,578 B2
(45) Date of Patent: Jun. 16, 2026

(54) DEPOSITION METHOD FOR SEMICONDUCTOR DEVICE

(71) Applicant: Taiwan Semiconductor Manufacturing Co., Ltd., Hsinchu (TW)

(72) Inventors: Chung-Ting Ko, Kaohsiung City (TW); Sung-En Lin, Xionglin Township (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 652 days.

(21) Appl. No.: 18/151,901

(22) Filed: Jan. 9, 2023

(65) Prior Publication Data

US 2024/0079265 A1 Mar. 7, 2024

Related U.S. Application Data

(60) Provisional application No. 63/374,812, filed on Sep. 7, 2022.

(51) Int. Cl.
| | |
|---|---|
| *H10W 10/00* | (2026.01) |
| *B82Y 10/00* | (2011.01) |
| *H10D 30/01* | (2025.01) |
| *H10D 30/43* | (2025.01) |
| *H10D 30/67* | (2025.01) |
| *H10D 30/69* | (2025.01) |
| *H10D 62/10* | (2025.01) |
| *H10D 62/13* | (2025.01) |
| *H10D 62/822* | (2025.01) |

(Continued)

(52) U.S. Cl.
CPC ........ *H10W 10/014* (2026.01); *H10D 30/014* (2025.01); *H10D 64/017* (2025.01); *H10W 10/17* (2026.01)

(58) Field of Classification Search
CPC .............. C23C 16/045; C23C 16/4408; C23C 16/45534; C23C 16/45536; C23C 16/0272; C23C 16/405; C23C 16/45523; C23C 16/45553; C23C 16/34; C23C 16/45527; C23C 16/56; H01L 21/02271; H01L 21/02189; H01L 21/02274; H01L 21/0228; H01L 21/76224; H01L 21/28568; H01L 21/32135; H01L 21/28562; H01L 21/76879; H01L 21/28556; H01L 21/30655
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |

(Continued)

FOREIGN PATENT DOCUMENTS

TW 202129723 A 8/2021

*Primary Examiner* — Sonya McCall-Shepard
(74) *Attorney, Agent, or Firm* — Slater Matsil, LLP

(57) ABSTRACT

A method includes depositing a first material on a sidewall surface of a recess in a substrate, wherein the first material is a conductive material; after depositing the first material, depositing a second material on a bottom surface of the recess using a plasma-assisted deposition process; and after depositing the second material, removing the first material.

20 Claims, 56 Drawing Sheets

(51) Int. Cl.
  *H10D 64/01*      (2025.01)
  *H10W 10/17*      (2026.01)

(56)              References Cited

U.S. PATENT DOCUMENTS

|  |  |  |  |
|---|---|---|---|
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 2021/0090948 | A1* | 3/2021 | Chen ................. H01L 21/76882 |
| 2021/0242081 | A1 | 8/2021 | Wu et al. |
| 2021/0327760 | A1* | 10/2021 | Ho ................... H01L 21/02126 |

* cited by examiner

DEPOSITION METHOD FOR SEMICONDUCTOR DEVICE

PRIORITY CLAIM AND CROSS-REFERENCE

This application claims the benefit of U.S. Provisional Application No. 63/374,812, filed on Sep. 7, 2022, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
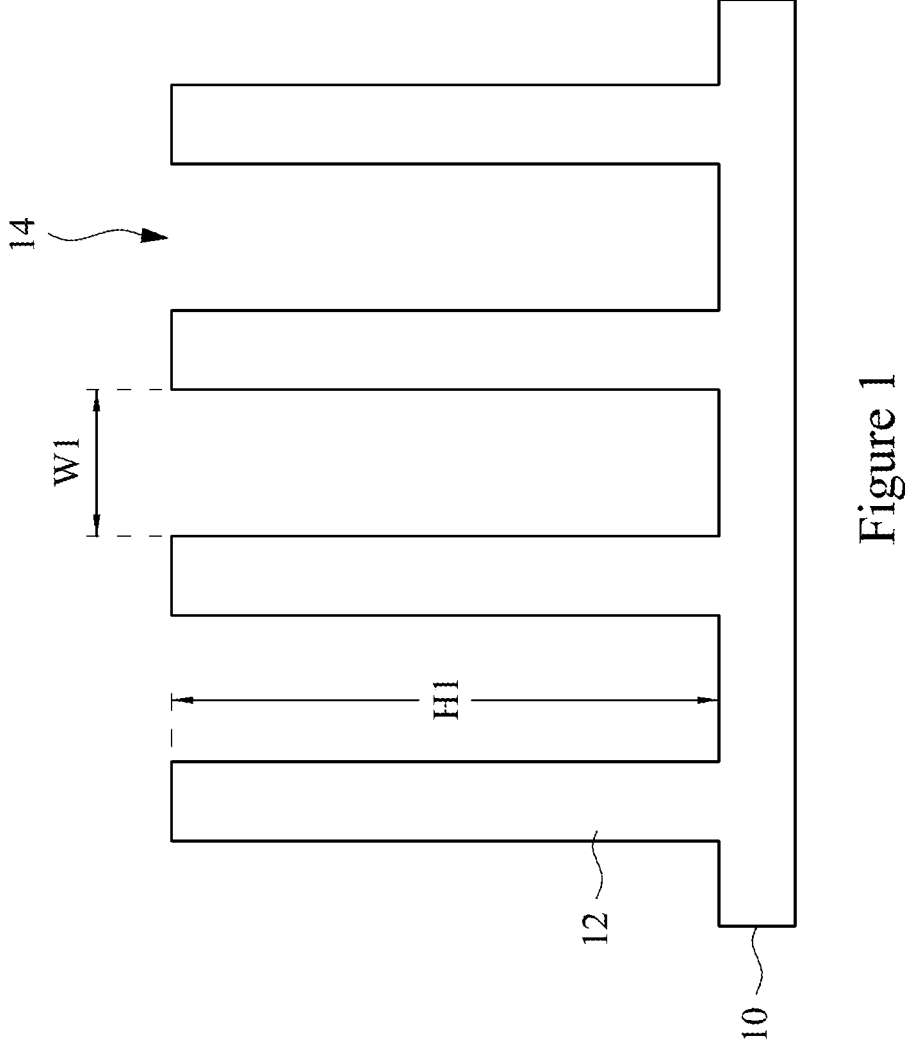
FIGS. 1, 2, 3, 4, 5, and 6 are cross-sectional views of intermediate steps in a bottom-up deposition process, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments described herein describe a technique for depositing material within a recess (e.g., a trench) using a plasma-assisted process. A repulsive material is initially deposited on surfaces near the top of the recess. The repulsive material may be a metallic or conductive material that captures ions during the subsequently-performed plasma-assisted deposition. This creates an electric charge within the repulsive material that repels the plasma, which redirects the plasma into the recess. The plasma converges within the recess and is more easily able to react with reaction sites near the bottom of the recess. In this manner, the material may be deposited within the recess in a bottom-up fashion with less formation of seams or voids.

Some embodiments are described below in a particular context, a die comprising nano-FETs. Various embodiments may be applied, however, to dies comprising other types of transistors (e.g., fin field effect transistors (FinFETs), planar transistors, or the like) in lieu of or in combination with the nano-FETs. Various embodiments may also be applied to dies, packages, or the like comprising other structures or devices. Additionally, some embodiments are described in the context of a Plasma-Enhanced Atomic Layer Deposition (PEALD) system and method, but the bottom-up deposition techniques described herein may be applied to a Plasma-Enhanced Chemical Vapor Deposition (PECVD) system or method in other embodiments.

FIGS. 1 through 6 illustrate intermediate steps in the bottom-up deposition of a material on a substrate 10, in accordance with some embodiments. FIG. 1 illustrates a cross-sectional view of a structure formed on a substrate 10 that includes recesses 86, in accordance with some embodiments. The substrate 10 may be, for example, a semiconductor structure, a wafer (e.g., a silicon wafer), a device, a package, an interposer, or the like. The substrate 10 may be similar to the substrate 50 described below for FIG. 8, in some embodiments. The substrate 10 may have been previously processed such that trenches 14 (e.g., recesses, openings, gaps, or the like) have been formed. For example, FIG. 1 illustrates a structure in which fins 12 have been formed on the substrate 10, with the fins 12 being separated by the trenches 14. The structure shown in FIG. 1 is an illustrative example, and other suitable structures are fully intended to be included within the scope of the present disclosure.

In some embodiments, the trenches 14 may have a height H1 that is in the range of about 120 nm to about 200 nm, though other heights are possible. In some embodiments, the trenches 14 may have a width W1 that is in the range of about 8 nm to about 30 nm, though other widths are possible.

In some embodiments, the trenches 14 may have an aspect ratio (e.g., W1:H1) that is in the range of about 1:6 to about 1:10, though other aspect ratios are possible. In some cases, the use of the bottom-up deposition techniques described herein allow for improved deposition within trenches 14 having large aspect ratios.

Figure 2:
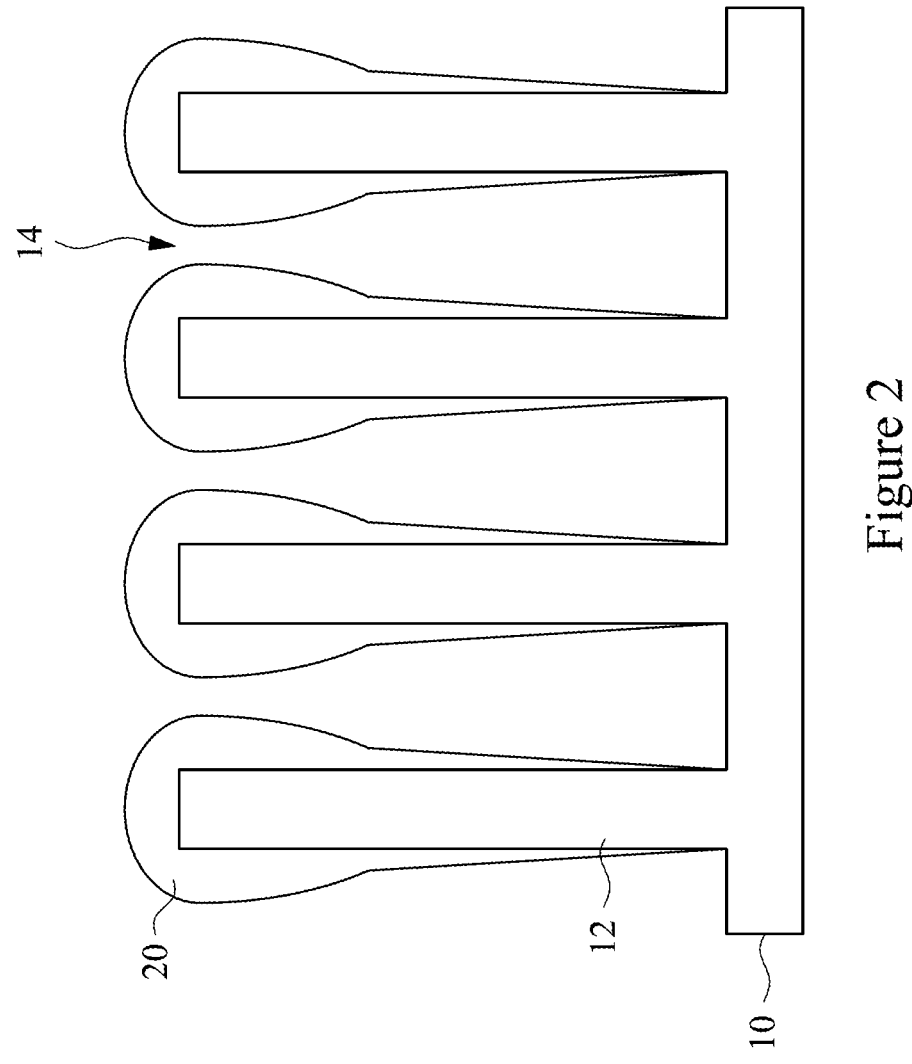

In FIG. 2, a repulsive material 20 is deposited on surfaces near the top of the trenches 14, in accordance with some embodiments. The repulsive material 20 is utilized during subsequent deposition steps to facilitate bottom-up deposition with in the trenches 14, described in greater detail below. In some cases, the repulsive material 20 may be considered a "sacrificial material." The repulsive material 20 may or may not be present in the final structure after processing. The repulsive material 20 may be deposited on sidewalls of the trenches 14 and on top surfaces adjacent the trenches 14, in some embodiments. For example, FIG. 2 illustrates the repulsive material 20 deposited on sidewalls of the fins 12 and on top surfaces of the fins 12. In some cases, the repulsive material 20 may also be deposited on bottom surfaces of the trenches 14. A thickness of the repulsive material 20 at or near the top of the trenches 14 (e.g., at or near top surfaces of the fins 12) may be greater than a thickness of the repulsive material 20 within the trenches 14, in some cases.

In some embodiments, the repulsive material 20 comprises a metal or another conductive material. For example, in some embodiments, the repulsive material 20 comprises a metal such as aluminum, tungsten, titanium, platinum, the like, or a combination thereof; or a conductive material such as zinc oxide (e.g., ZnO), tin oxide (e.g., SnO), titanium nitride (e.g., TiN), the like, or a combination thereof. Other materials or combinations of materials are possible.

The repulsive material 20 may be deposited using a suitable technique, such as Physical Vapor Deposition (PVD), CVD, or the like. For example, in some embodiments, the repulsive material 20 may be titanium nitride deposited using a PVD process. The PVD process may comprise using a titanium target and gaseous $N_2$. In some embodiments, the PVD process may comprise a process temperature in the range of about 200° C. to about 500° C. or a process pressure in the range of about 0.01 Torr to about 1.0 Torr. The PVD process may comprise a DC power in the range of about 20 kW to about 40 kW or a RF power in the range of about 100 W to about 500 W. This is an example, and other materials, deposition techniques, or process parameters are possible.

Figure 3:
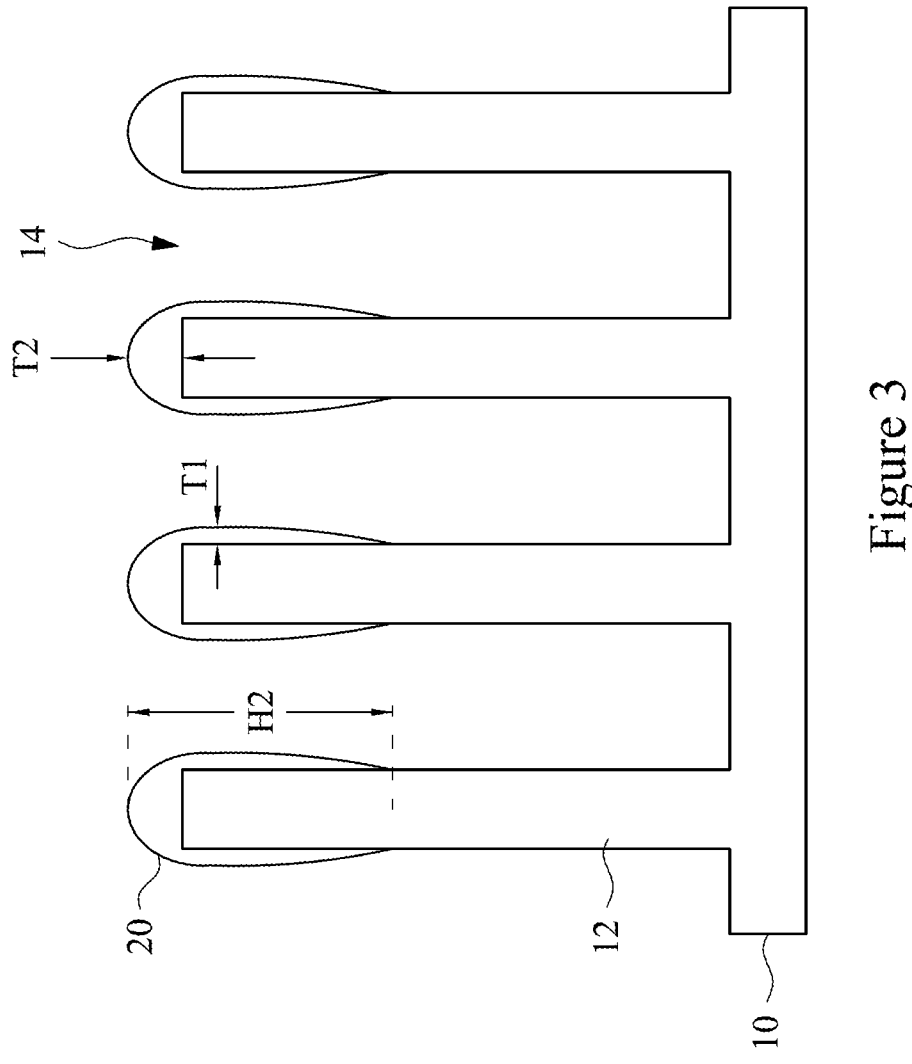

In FIG. 3, an etching process is performed on the repulsive material 20, in accordance with some embodiments. The etching process may be performed to remove repulsive material 20 from bottom surfaces and/or sidewall surfaces of the trenches 14. The etching process may reduce a thickness (e.g., thin) the repulsive material 20. In some embodiments, the etching process comprises an isotropic etch, such as an isotropic wet etch. For example, in some embodiments, the etching process comprises dilute hydrofluoric acid (dHF) having an HF:water volume ratio in the range of about 1:100 to about 1:3. Other etchants are possible. In some embodiments, the etching process may be performed for between about 1 second and about 600 seconds. Other etching processes, etchants, or process parameters are possible. In other embodiments, the etching process is omitted.

In some embodiments, after performing the etching process, portions of the repulsive material 20 remain at or near the top of the trenches 14 (e.g., at or near top surfaces of the fins 12). The remaining portions of the repulsive material 20 may be on sidewall surfaces of the trench 14 and/or on top surfaces adjacent the trenches 14 (e.g., on top surfaces of the fins 12). In some embodiments, a height H2 of the remaining portions of the repulsive material 20 may be in the range of about 20 nm to about 50 nm, though other heights are possible. In some embodiments, the remaining portions of the repulsive material 20 on the sidewall surfaces of the trenches 14 may have a thickness T1 in the range of about 1 nm to about 6 nm, though other thicknesses are possible. In some embodiments, the remaining portions of the repulsive material 20 on the top surfaces adjacent the trenches 14 may have a thickness T2 in the range of about 1 nm to about 10 nm, though other thicknesses are possible.

Figure 4:
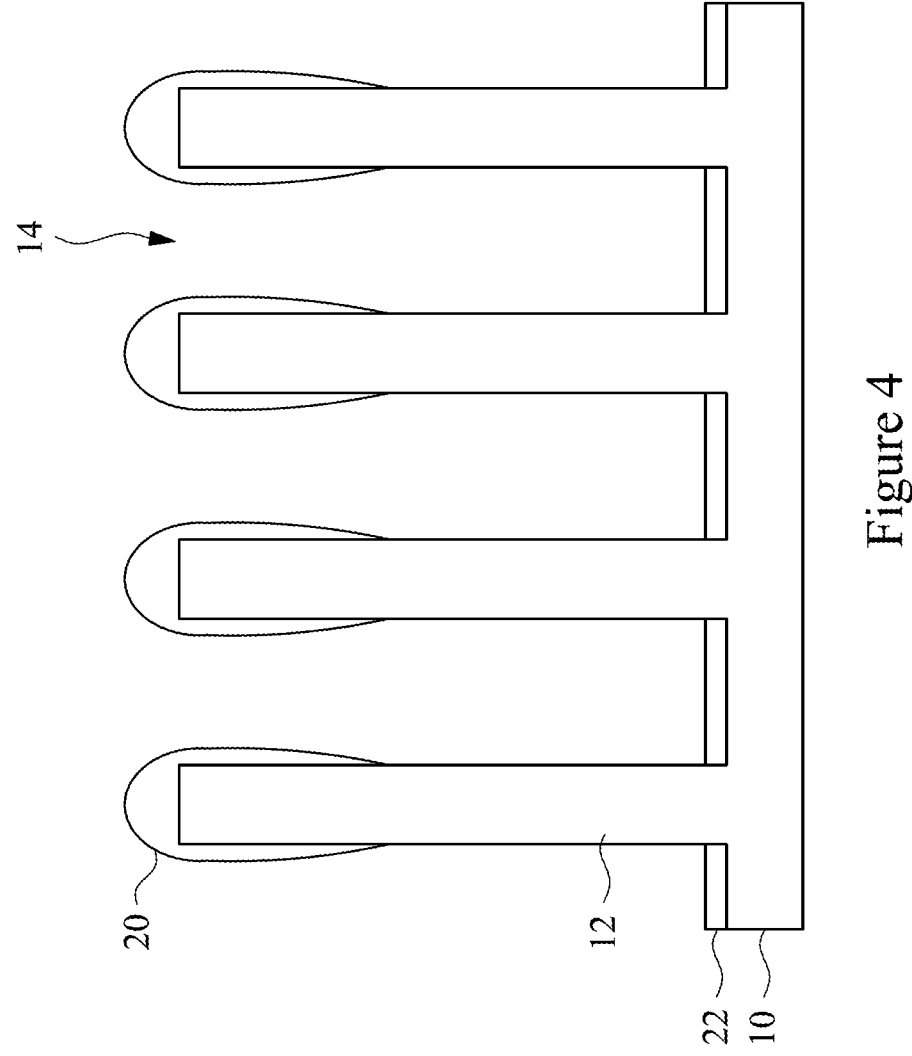
Figure 5:
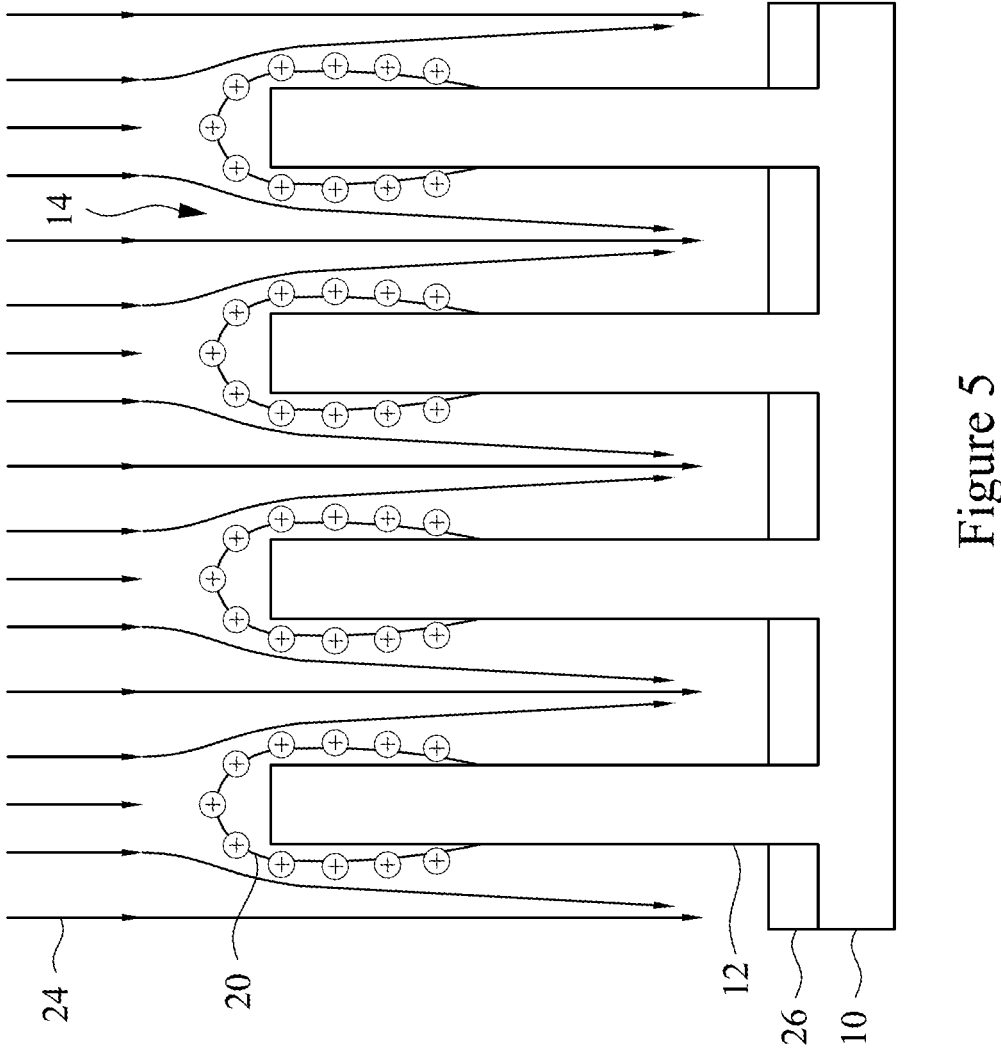
Figure 6:
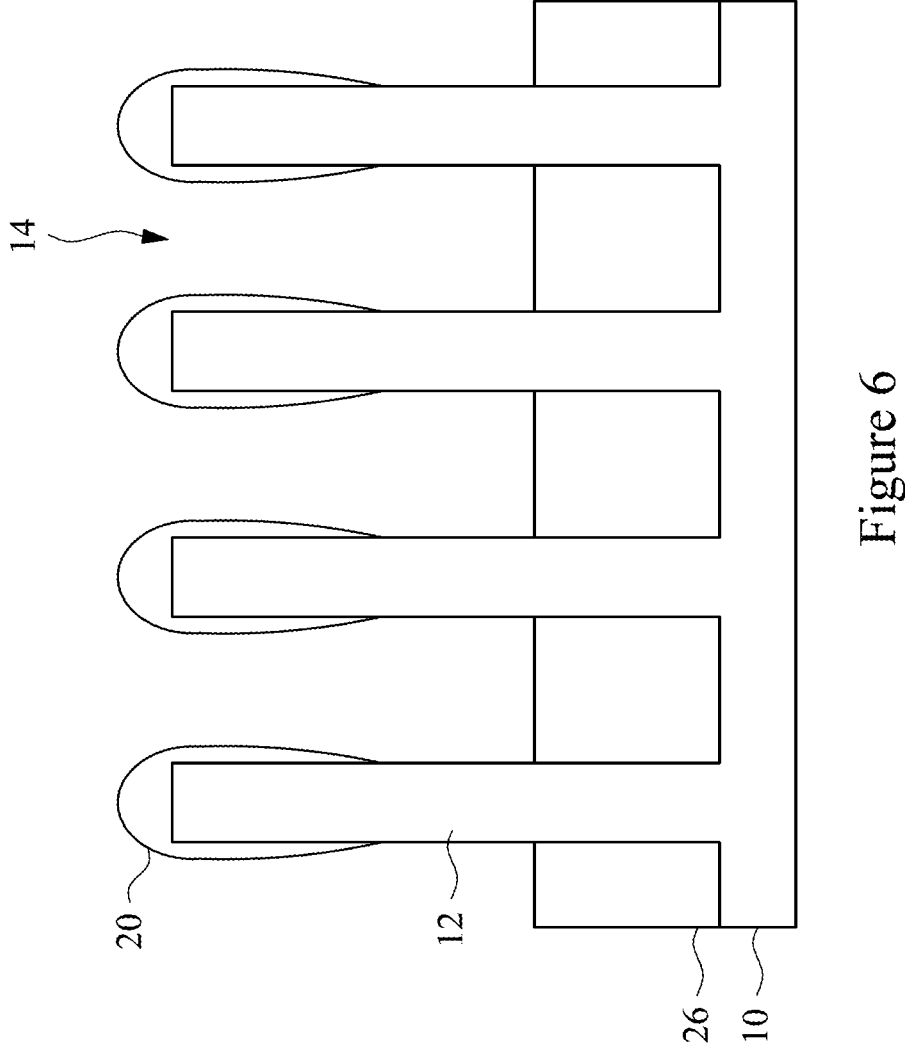

FIGS. 4 through 6 illustrate the bottom-up deposition of a material 26 (see FIGS. 5-6) within the trenches 14, in accordance with some embodiments. The material 26 may be an oxide, a nitride, a carbide, a metal, the like, or a combination thereof. For example, in some embodiments, the material 26 comprises silicon oxide (e.g., SiO), silicon nitride (e.g., SiN), silicon oxycarbide (e.g., SiOC), silicon carbonitride (e.g., SiCN), the like, or a combination thereof. Other materials are possible. The bottom up-deposition may be performed using a plasma-assisted deposition process, such as a Plasma-Enhanced Chemical Vapor Deposition (PECVD) process, a Plasma-Enhanced Atomic Layer Deposition (PEALD) process, or the like.

In some embodiments, the material 26 may be deposited by performing a plurality of deposition cycles (e.g., CVD cycles or ALD cycles). Each deposition cycle may comprise, for example, a first step comprising exposing the substrate 10 to a first precursor to form a first reaction product 22 (see FIG. 4) on surfaces, and a second step comprising exposing the first reaction product 22 to a second precursor that reacts with the first reaction product to form a layer of the material 26 (see FIG. 5). The deposition cycle may be performed repeatedly to deposit the material 26 to a desired thickness. An deposition cycle may comprise more than two steps and/or more than two precursors in other embodiments. In some embodiments, one or more steps of the deposition cycle comprises forming a plasma of the step's corresponding precursor. In some embodiments, the repulsive material 20 may create a repulsive electrostatic force during such plasma-assisted steps of the deposition cycle that facilitates reactions at or near the bottom of the trenches 14. In this manner, the techniques described herein may allow for improved bottom-up deposition of a material (e.g., material 26), with little or no formation of voids or seams.

Figure 30A:
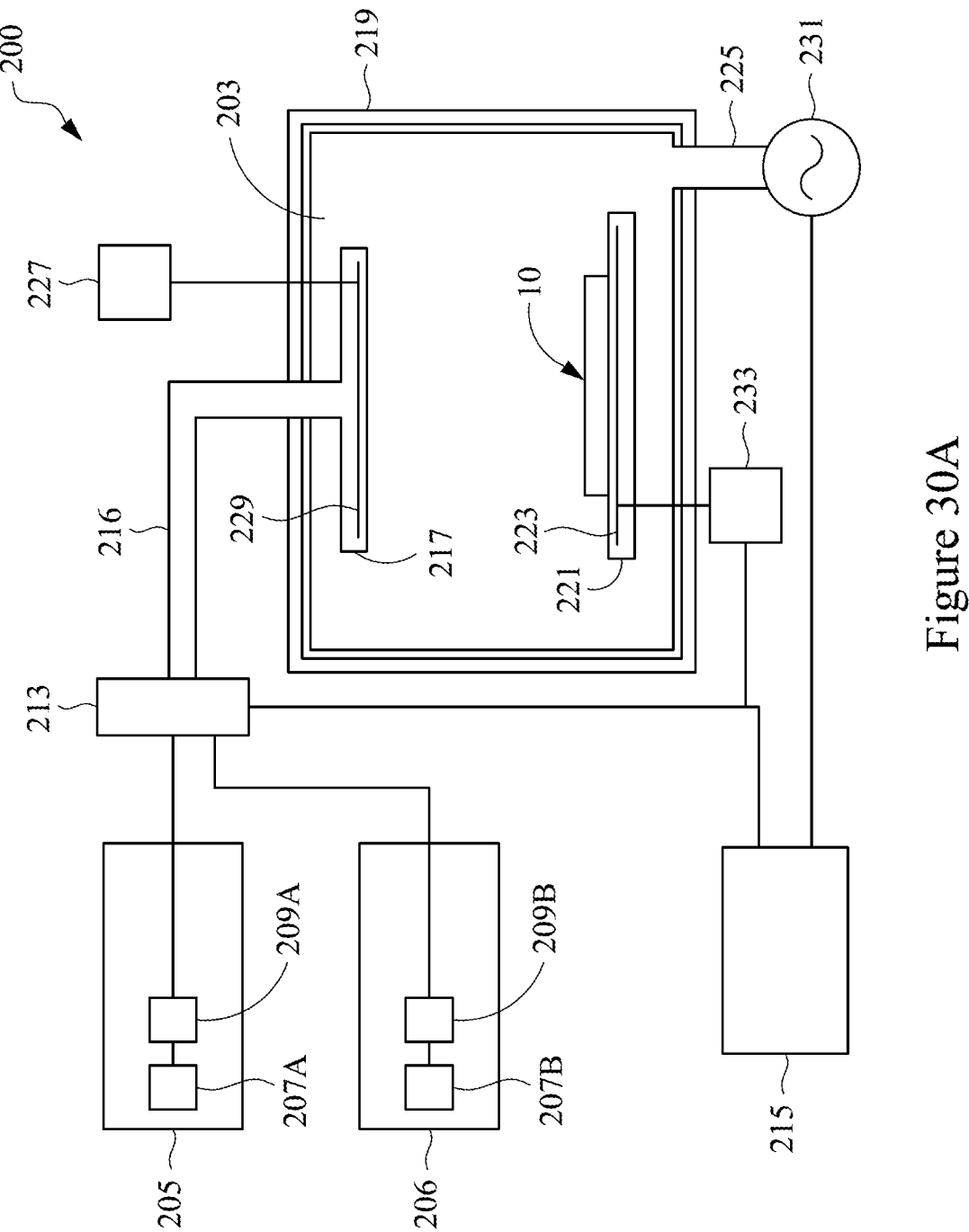
FIGS. 30A and 30B illustrate a deposition system, in accordance with some embodiments.
Figure 30B:
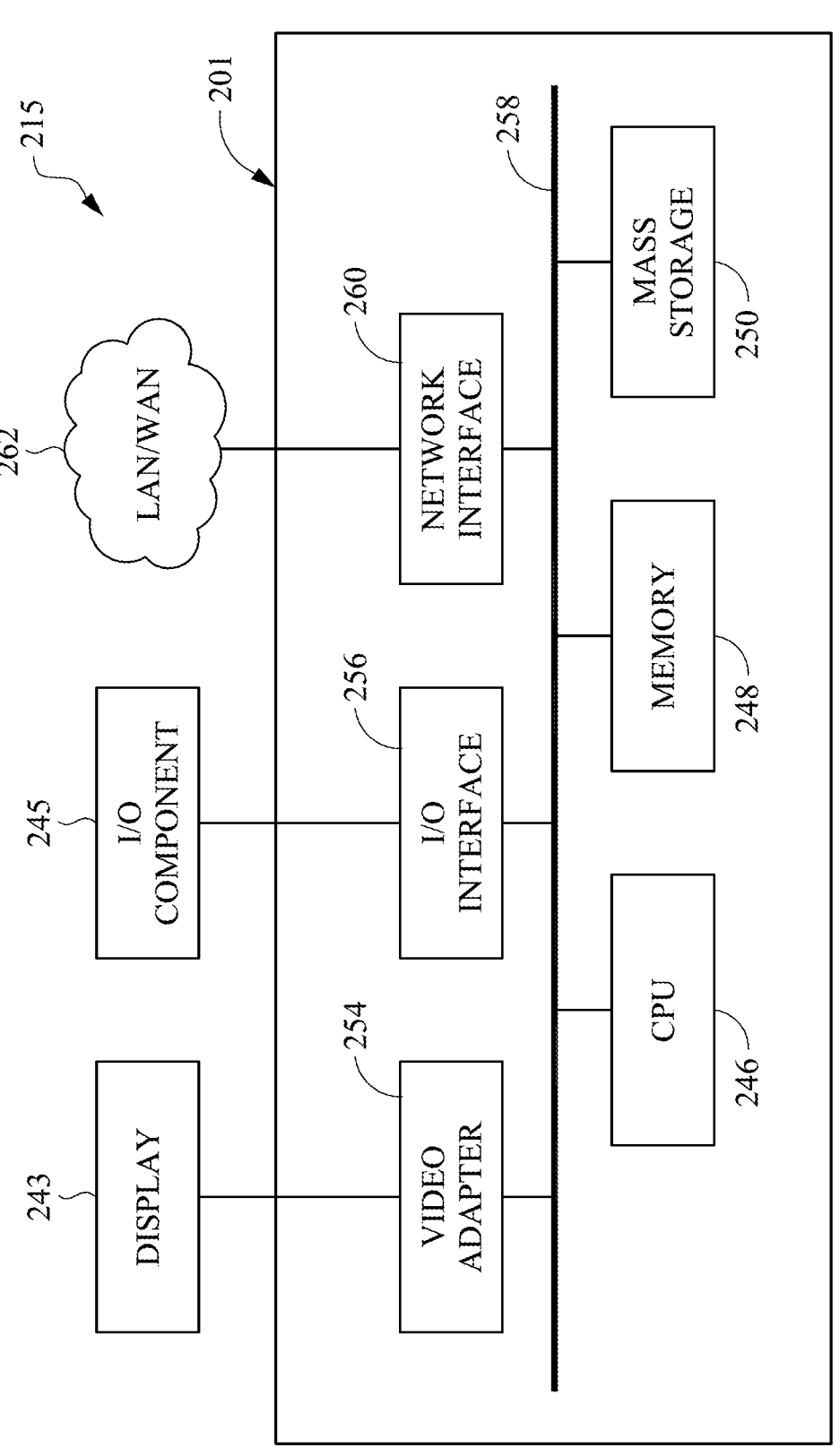

Turning to FIGS. 30A and 30B, a deposition system 200 is shown that may be utilized to perform a bottom-up deposition process, such as that described below for FIGS. 4-6. In some embodiments, the deposition system 200 receives precursor materials from a first precursor delivery system 205 and a second precursor delivery system 206 and forms layers of materials onto a workpiece, shown in FIG. 30A as the substrate 10. The first precursor delivery system 205 and the second precursor delivery system 206 may work in conjunction with one another to supply the various different precursor materials to a deposition chamber 203 within which the substrate 10 is placed. In some cases, the first precursor delivery system 205 and the second precursor delivery system 206 may have physical components that are similar with each other. For example, the first precursor delivery system 205 may include a gas supply 207A and a flow controller 209A, and the second precursor delivery system 206 may include a gas supply 207B and a flow controller 209B. In an embodiment in which a precursor is stored in a gaseous state, a gas supply 207A/B may supply the precursor to the deposition chamber 203. The gas supply 207A/B may be a vessel, such as a gas storage tank, that is located either locally to the deposition chamber 203 or else may be located remotely from the deposition chamber 203. In another embodiment, the gas supply 207A/B may be a facility that independently prepares and delivers the precursor to the respective flow controller 209A/B. Any suitable source for a precursor may be utilized as the gas supply 207A and/or 207B, and all such sources are fully intended to be included within the scope of the embodiments.

The gas supply 207A/B may supply the desired precursor to the respective flow controller 209A/B. The flow controller 209A/B may be utilized to control the flow of the precursor to the precursor gas controller 213 and, eventually, to the deposition chamber 203, thereby also helping to control the pressure within the deposition chamber 203. The flow controller 209A and/or 209B may be, e.g., a proportional valve, a modulating valve, a needle valve, a pressure regulator, a mass flow controller, combinations of these, or the like. However, any suitable method for controlling and regulating the flow of the gas to the precursor gas controller 213 may be utilized, and all such components and methods are fully intended to be included within the scope of the embodiments.

As one of ordinary skill in the art will recognize, while the first precursor delivery system 205 and the second precursor delivery system 206 have been described herein as having identical components, this is merely an illustrative example and is not intended to limit the embodiments in any fashion. Any type of suitable precursor delivery system, with any type and number of individual components identical to or different from any of the other precursor delivery systems within the deposition system 200, may be utilized. All such precursor systems are fully intended to be included within the scope of the embodiments.

Additionally, in an embodiment in which a precursor is stored in a solid or liquid state, the gas supply 207A/B may store a carrier gas and the carrier gas may be introduced into a precursor canister (not separately illustrated), which stores the precursor in the solid or liquid state. The carrier gas is then used to push and carry the precursor as it evaporates or sublimates into a gaseous section of the precursor canister before being sent to the precursor gas controller 213. Any suitable method and combination of components may be utilized to provide the precursor, and all such combination of components are fully intended to be included within the scope of the embodiments.

The first precursor delivery system 205 and the second precursor delivery system 206 may supply their individual precursor materials into a precursor gas controller 213. The precursor gas controller 213 connects and isolates the first precursor delivery system 205 and the second precursor delivery system 206 from the deposition chamber 203 in order to deliver the desired precursor materials to the deposition chamber 203. The precursor gas controller 213 may include such devices as valves, flow meters, sensors, and the like to control the delivery rates (e.g., flow rates) of each of the precursors, and may be controlled by instructions received from the control unit 215 (described further below with respect to FIG. 30B).

The precursor gas controller 213, upon receiving instructions from the control unit 215, may open and close valves so as to connect one or more of the first precursor delivery system 205 and the second precursor delivery system 206 to the deposition chamber 203 and direct a desired precursor material through a manifold 216, into the deposition chamber 203, and to a showerhead 217. The showerhead 217 may be utilized to disperse the chosen precursor material(s) into the deposition chamber 203 and may be designed to evenly disperse the precursor material in order to minimize undesired process conditions that may arise from uneven dispersal. In an embodiment the showerhead 217 may have a circular design with openings dispersed evenly around the showerhead 217 to allow for the dispersal of the desired precursor material into the deposition chamber 203.

However, as one of ordinary skill in the art will recognize, the introduction of precursor materials to the deposition chamber 203 through a single showerhead 217 or through a single point of introduction as described above is intended to be illustrative only and is not intended to be limiting to the embodiments. Any number of separate and independent showerheads 217 or other openings to introduce precursor materials into the deposition chamber 203 may be utilized. All such combinations of showerheads and other points of introduction are fully intended to be included within the scope of the embodiments.

The deposition chamber 203 may receive the desired precursor materials and expose the substrate 10 to the precursor materials, and the deposition chamber 203 may be any desired shape that may be suitable for dispersing the precursor materials and contacting the precursor materials with the substrate 10. In the embodiment illustrated in FIG. 30A, the deposition chamber 203 has a cylindrical sidewall and a bottom. However, the deposition chamber 203 is not limited to a cylindrical shape, and any other suitable shape, such as a hollow square tube, an octagonal shape, or the like, may be utilized. Furthermore, the deposition chamber 203 may be surrounded by a housing 219 made of material that is inert to the various process materials. As such, while the housing 219 may be any suitable material that can withstand the chemistries and pressures involved in the deposition process, in an embodiment the housing 219 may be steel, stainless steel, nickel, aluminum, alloys of these, the like, or combination thereof.

Within the deposition chamber 203 the substrate 10 may be placed on a mounting platform 221 in order to position and control the substrate 10 during the deposition processes. The mounting platform 221 may include heating mechanisms in order to heat the substrate 10 during the deposition processes. For example, the mounting platform 221 may be heated during a thermal ALD process.

In some embodiments, a precursor material may be ignited into a plasma in order to assist in the deposition process, such as for a plasma ALD process (e.g., a PEALD process). In this embodiment, the mounting platform 221 may additionally comprise a first electrode 223 coupled to a first RF generator 233. The first electrode 223 may be electrically biased by the first RF generator 233 (under control of the control unit 215) at a RF voltage during the deposition process. By being electrically biased, the first electrode 223 is used to provide a bias to the incoming second precursor material as well as assist to ignite the precursor material into a plasma. Additionally, the first electrode 223 is also utilized to maintain the precursor plasma during the deposition process by maintaining the bias. In some embodiments, the plasma may have a self-bias or an external bias to support the formation of plasma convergence.

In an embodiment, the showerhead 217 may also be or comprise (or otherwise incorporate) a second electrode 229 for use as a plasma generator to assist in the deposition chamber 203. In an embodiment the plasma generator may be a transformer coupled plasma generator and may be, e.g., a coil. The coil may be attached to a second RF generator 227 that is utilized to provide power to the second electrode 229 (under control of the control unit 215) in order to ignite the plasma during introduction of the precursor material.

However, while the second electrode 229 is described above as a transformer coupled plasma generator, embodiments are not intended to be limited to a transformer coupled plasma generator. Rather, any suitable method of generating the plasma, such as inductively coupled plasma systems, magnetically enhanced reactive ion etching, electron cyclotron resonance, a remote plasma generator, or the like, may be utilized. All such methods are fully intended to be included within the scope of the embodiments.

Furthermore, while a single mounting platform 221 is illustrated in FIG. 30A, any number of mounting platforms 221 may additionally be included within the deposition chamber 203. Additionally, the deposition chamber 203 and the mounting platform 221 may be part of a cluster tool system (not shown). The cluster tool system may be used in conjunction with an automated handling system in order to position and place the substrate 10 into the deposition chamber 203 prior to the deposition processes, position, hold the substrate 10 during the deposition processes, and remove the substrate 10 from the deposition chamber 203 after the deposition processes.

The deposition chamber 203 may also have an exhaust outlet 225 for exhaust gases to exit the deposition chamber 203. A vacuum pump 231 may be connected to the exhaust outlet 225 of the deposition chamber 203 in order to help evacuate the exhaust gases. The vacuum pump 231, under control of the control unit 215, may also be utilized to reduce and control the pressure within the deposition chamber 203 to a desired pressure and may also be utilized to evacuate precursor materials from the deposition chamber 203 in preparation for the introduction of the next precursor material.

FIG. 30B illustrates an embodiment of the control unit 215 that may be utilized to control the precursor gas controller 213 and the vacuum pump 231 (as illustrated in FIG. 30A). The control unit 215 may be any form of computer processor that can be used in an industrial setting for controlling process machines. In an embodiment the control unit 215 may comprise a processing unit 201, such as a desktop computer, a workstation, a laptop computer, or a dedicated unit customized for a particular application. The control unit 215 may be equipped with a display 243 and one or more input/output components 245, such as instruction outputs, sensor inputs, a mouse, a keyboard, printer, combinations of these, or the like. The processing unit 201 may include a central processing unit (CPU) 246, memory 248, a mass storage device 250, a video adapter 254, and an I/O interface 256 connected to a bus 258.

The bus 258 may be one or more of any type of several bus architectures including a memory bus or memory controller, a peripheral bus, or video bus. The CPU 246 may comprise any type of electronic data processor, and the memory 248 may comprise any type of system memory, such as static random access memory (SRAM), dynamic random access memory (DRAM), or read-only memory (ROM). The mass storage device 250 may comprise any type of storage device configured to store data, programs, and other information and to make the data, programs, and other information accessible via the bus 258. The mass storage device 250 may comprise, for example, one or more of a hard disk drive, a magnetic disk drive, or an optical disk drive.

The video adapter 254 and the I/O interface 256 provide interfaces to couple external input and output devices to the processing unit 201. As illustrated in FIG. 30B, examples of input and output devices include the display 243 coupled to the video adapter 254 and the I/O component 245, such as a mouse, keyboard, printer, and the like, coupled to the I/O interface 256. Other devices may be coupled to the processing unit 201, and additional or fewer interface cards may be utilized. For example, a serial interface card (not shown) may be used to provide a serial interface for a printer. The processing unit 201 also may include a network interface 260 that may be a wired link to a local area network (LAN) or a wide area network (WAN) 262 and/or a wireless link.

It should be noted that the control unit 215 may include other components. For example, the control unit 215 may include power supplies, cables, a motherboard, removable storage media, cases, and the like. These other components, although not shown in FIG. 30B, are considered part of the control unit 215.

Turning back to FIG. 4, a first precursor material may be flowed (e.g., "pulsed") into the deposition chamber (e.g., deposition chamber 203) as part of the first step of the deposition cycle. The first precursor material adsorbs on and reacts with exposed surfaces of the substrate 10, forming a first reaction product 22 that is bonded to those surfaces. As shown in FIG. 4, the first reaction product 22 is formed on bottom surfaces of the trenches 14 and may also be formed on sidewall surfaces of the trenches 14. The first reaction product 22 may be a single layer of molecules, in some cases. Once the first precursor material has reacted with all available reaction sites on the surfaces, no further first reaction product 22 can be formed. In this manner, the formation of the first reaction product 22 may be a "self-limiting reaction." In some embodiments, the repulsive material 20 may block the first reaction product 22 from forming on upper surfaces of the trenches 14. In other embodiments, the first precursor material may be ignited into a plasma during the first step of the deposition cycle.

After the first precursor material has reacted, the deposition chamber may then be purged of excess first precursor material or other reaction products. The purging may be performed before or after the self-limiting reaction that forms the first reaction product 22 is finished. The purging may be performed, for example, by flowing a purge gas such as nitrogen, argon, xenon, or the like into the deposition chamber.

In FIG. 5, the second precursor material may be flowed (e.g., "pulsed") into the deposition chamber (e.g., deposition chamber 203) as part of the second step of the deposition cycle. During or after the second precursor material is introduced into the deposition chamber, the second precursor material may be ignited into a plasma 24 in order to assist in the deposition process. The second precursor material adsorbs on and reacts with the first reaction product 22 to form the material 26. As shown in FIG. 5, the material 26 is formed on bottom surfaces of the trenches 14 and may also be formed on sidewall surfaces of the trenches 14. The material 26 formed by the second step may be a single layer of molecules (e.g., a monolayer of material 26), in some cases. Once the second precursor material has reacted with all available reaction sites on the first reaction product 22, no further material 26 can be formed. In this manner, the formation of the material 26 may be a "self-limiting reaction."

In some cases, the repulsive material 20 can capture positively-charged ions present in the plasma 24. These captured positively-charged ions, represented in FIG. 5 by "+" symbols, can cause the surfaces of the repulsive material 20 to have a positive charge. The electrostatic repulsion between the positively-charged surfaces of the repulsive material 20 and the plasma 24 can cause more of the plasma 24 to be directed into the trenches 14, as shown in FIG. 5. In other words, the presence of the repulsive material 20 allows more of the plasma 24 to be concentrated into the trenches 14 than if the repulsive material 20 were not present. By directing the plasma 24 into the trenches 14, the plasma 24 can more easily reach and react with reaction sites within the trench 14. In particular, the use of repulsive material 20 as described herein can allow more of the plasma 24 to reach reaction sites near the bottom of the trenches 14, allowing for bottom-up formation of the material 26 within the trenches 14. The techniques described herein can also allow for material 26 to be deposited at the bottom of the trenches 14 with little or no formation of seams or voids. Additionally, the techniques described herein can form a better quality material 26 at the bottom of trenches 14, such as material 26 having greater uniformity, greater density, or a more uniform etch rate.

After the second precursor material has reacted, the deposition chamber may then be purged of excess second precursor material or other reaction products. The purging may be performed before or after the self-limiting reaction that forms the material 26 is finished. The purging may be performed, for example, by flowing a purge gas such as nitrogen, argon, xenon, or the like into the deposition chamber. After the deposition chamber has been purged following the reaction of the second precursor material, a first deposition cycle for the formation of the desired material has been completed.

FIG. 6 illustrates the further bottom-up deposition of the material 26 after performing subsequent deposition cycles, in accordance with some embodiments. For example, additional deposition cycles similar to the first cycle may be repeatedly performed. For example, the repeated cycles may introduce the first precursor material, purge with the purge gas, pulse with the second precursor, ignite the second precursor into a plasma, and purge with the purge gas. These deposition cycles may be repeated multiple times until the material 26 is deposited to a desired thickness. In some embodiments, the repulsive material 20 may be subsequently removed using, for example, a chemical mechanical polishing (CMP) process, an etching process, or the like. In other embodiments, portions of the repulsive material 20 remain during subsequent processing.

The deposition cycle described for FIGS. 4-5 is an example, and other deposition cycles are possible. For example, in other embodiments, a deposition cycle may have more than two steps, more than two precursor materials, or other steps in which a plasma is formed. In other embodiments, two or more different deposition cycles having different process parameters may be used. As an example, for an embodiment in which the material 26 is silicon nitride (e.g., SiN), the first precursor material may be dichlorosilane (e.g., $SiH_2Cl_2$) or the like, and the second precursor material may be ammonia (e.g., $NH_3$) or the like. Other precursors are possible. In some embodiments, during the first step, the first precursor material is flowed at a rate in the range of about 5 slm to about 12 slm, the first precursor material is pulsed for between about 0.1 seconds and about 5 seconds, and the process pressure is in the range of about 1 Torr to about 3 Torr. In some embodiments, during the second step, the second precursor material is flowed at a rate in the range of about 5 slm to about 12 slm, the first precursor material is pulsed for between about 0.1 seconds and about 60 seconds, the RF power is in the range of about 50 W and about 500 W, and the process pressure is in the range of about 1 Torr to about 3 Torr. Other process parameters are possible.

Figure 7:
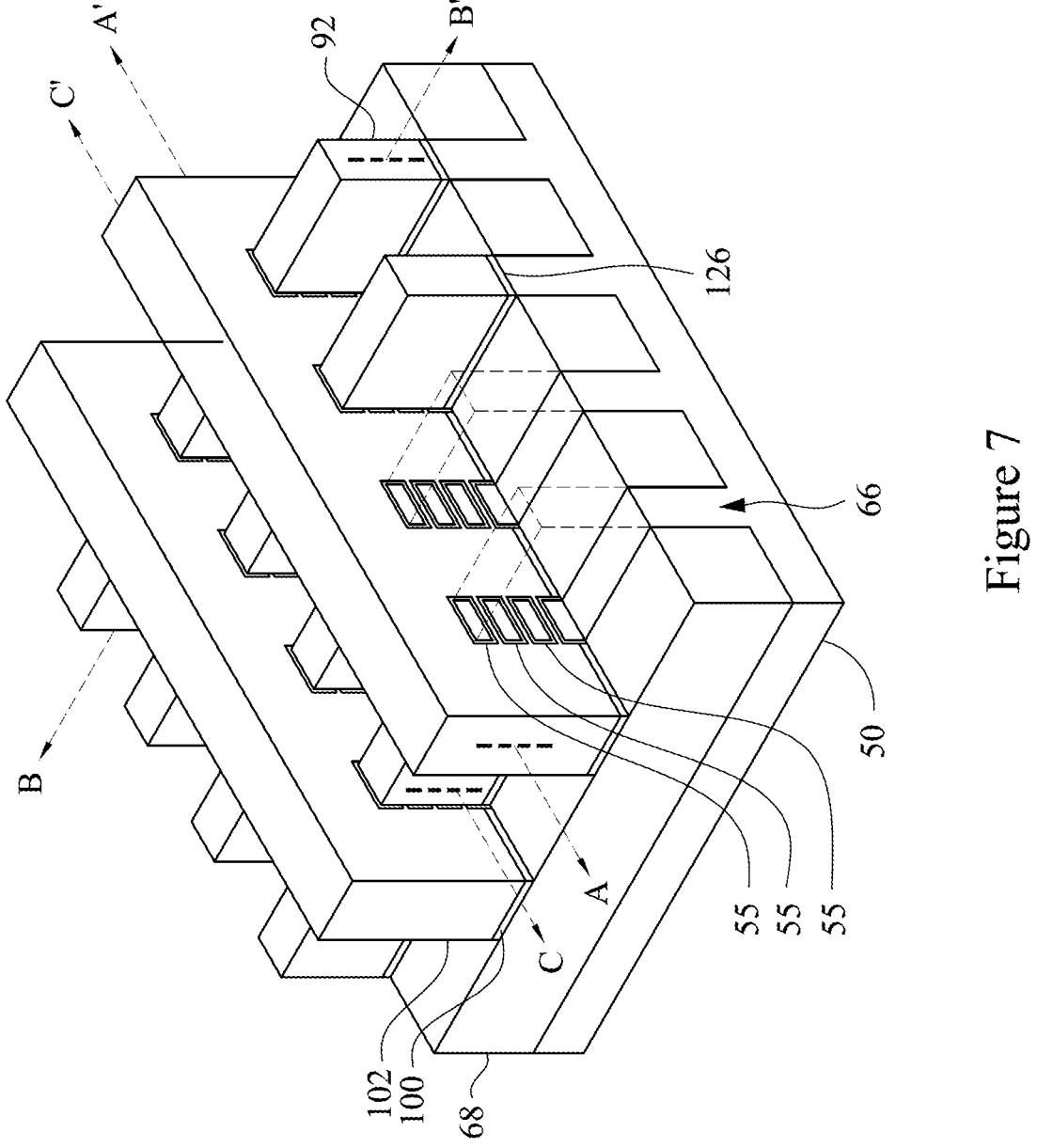
FIG. 7 illustrates an example of a nanostructure field-effect transistor (nano-FET) in a three-dimensional view, in accordance with some embodiments.

FIGS. 7 through 29C illustrate the formation of a nano-structure field-effect transistors (nano-FETs) utilizing a bottom up deposition technique similar to that described for FIGS. 1 through 6, in accordance with some embodiments. FIG. 7 illustrates an example of nano-FETs (e.g., nanowire FETs, nanosheet FETs, or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Isolation regions 68 are disposed between adjacent fins 66, which may protrude above and from between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may comprise a single material or a plurality of materials. In this context, the fins 66 refer to the portion extending between the neighboring isolation regions 68.

Gate dielectric layers 100 are over top surfaces of the fins 66 and along top surfaces, sidewalls, and bottom surfaces of the nanostructures 55. Gate electrodes 102 are over the gate dielectric layers 100. Epitaxial source/drain regions 92 are disposed over the fins 66 on opposing sides of the gate dielectric layers 100 and the gate electrodes 102. Source/drain region(s) 92 may refer to a source or a drain, individually or collectively dependent upon the context. An isolation layer 126 is formed between each source/drain region 92 and its underlying fin 66, in some embodiments. The isolation layer 126 may be formed using bottom-up deposition techniques similar to those described herein.

FIG. 7 further illustrates reference cross-sections that are used in later figures. Cross-section A-A' is along a longitudinal axis of a gate electrode 102 and in a direction, for example, perpendicular to the direction of current flow between the epitaxial source/drain regions 92 of a nano-FET. Cross-section B-B' is perpendicular to cross-section A-A' and is parallel to a longitudinal axis of a fin 66 of the nano-FET and in a direction of, for example, a current flow between the epitaxial source/drain regions 92 of the nano-FET. Cross-section C-C' is parallel to cross-section A-A' and extends through epitaxial source/drain regions of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 8 through 28C are cross-sectional views of intermediate stages in the manufacturing of nano-FETs, in accordance with some embodiments. FIGS. 8 through 11, 12A, 21A, 22A, 23A, 24A, 25A, 26A, 27A, and 28A illustrate reference cross-section A-A' illustrated in FIG. 7. FIGS. 12B, 13B, 14B, 15B, 16B, 17B, 17C, 18B, 19B, 20B, 20D, 21B, 22B, 23B, 24B, 25B, 26B, 27B, and 28B illustrate reference cross-section B-B' illustrated in FIG. 7. FIGS. 13A, 14A, 15A, 16A, 17A, 18A, 19A, 20A, 20C, 21C, 26C, 27C, and 28C illustrate reference cross-section C-C' illustrated in FIG. 7.

Figure 8:
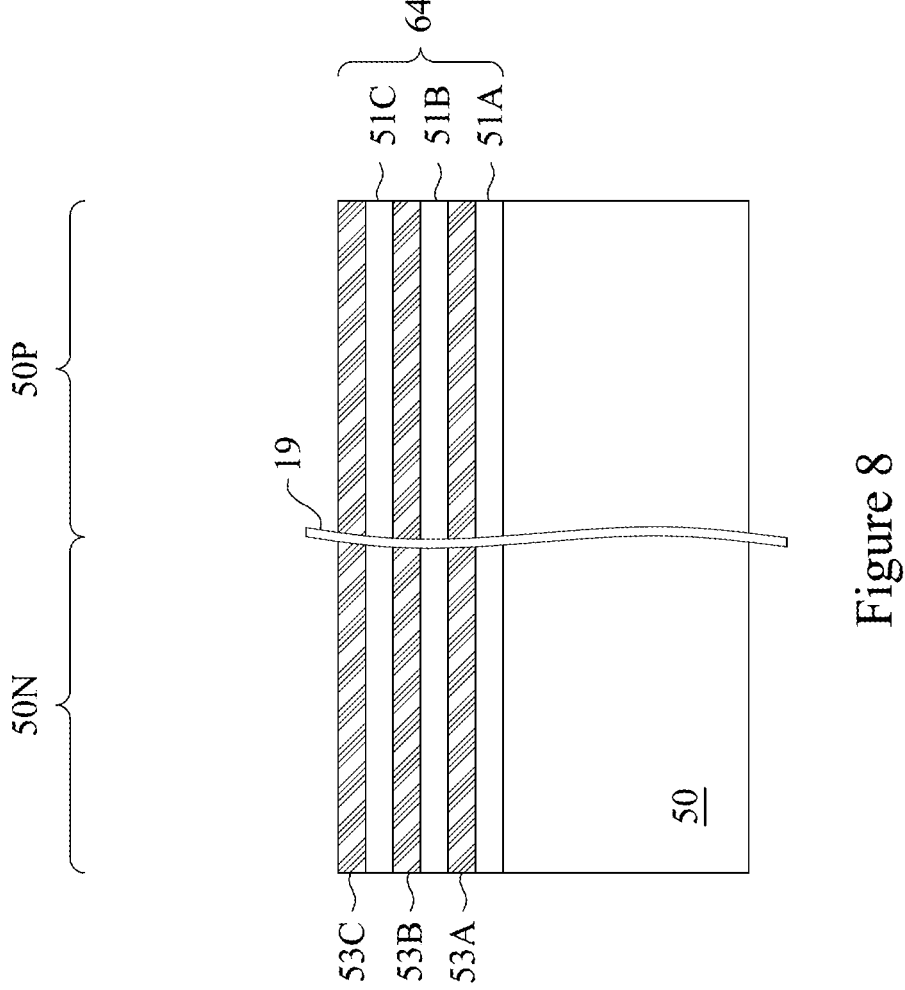
FIGS. 8, 9, 10, 11, 12A, 12B, 13A, 13B, 14A, 14B, 15A, 15B, 16A, 16B, 17A, 17B, 17C, 18A, 18B, 19A, 19B, 20A, 20B, 20C, 20D, 21A, 21B, 21C, 22A, 22B, 23A, 23B, 24A, 24B, 25A, 25B, 26A, 26B, 26C, 27A, 27B, 27C, 28A, 28B, and 28C are cross-sectional views of intermediate stages in the manufacturing of nano-FETs, in accordance with some embodiments.

In FIG. 8, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 19), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 8, a multi-layer stack 64 is formed over the substrate 50. The multi-layer stack 64 includes alternating layers of first semiconductor layers 51A-C (collectively referred to as first semiconductor layers 51) and second semiconductor layers 53A-C (collectively referred to as second semiconductor layers 53). For purposes of illustration and as discussed in greater detail below, the second semiconductor layers 53 will be removed and the first semiconductor layers 51 will be patterned to form channel regions of nano-FETs in the p-type region 50P. Also, the first semiconductor layers 51 will be removed and the second semiconductor layers 53 will be patterned to form channel regions of nano-FETs in the n-type region 50N. Nevertheless, in some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type region 50P.

Figure 29A:
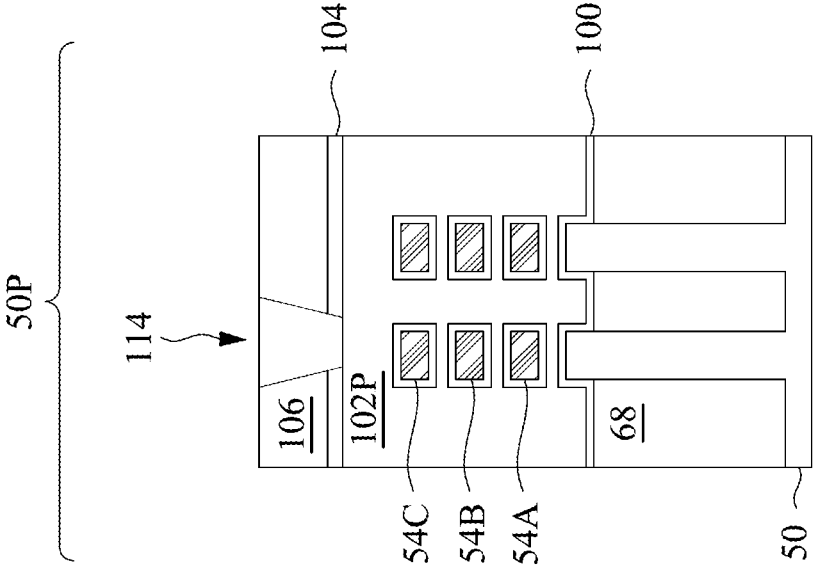
FIGS. 29A, 29B, and 29C are cross-sectional views of a nano-FET, in accordance with some embodiments.
Figure 29A:
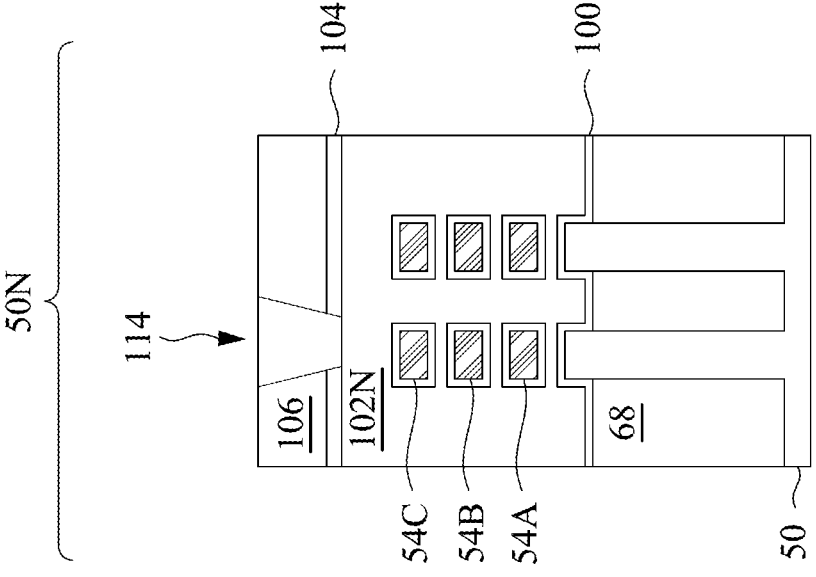
Figure 29B:
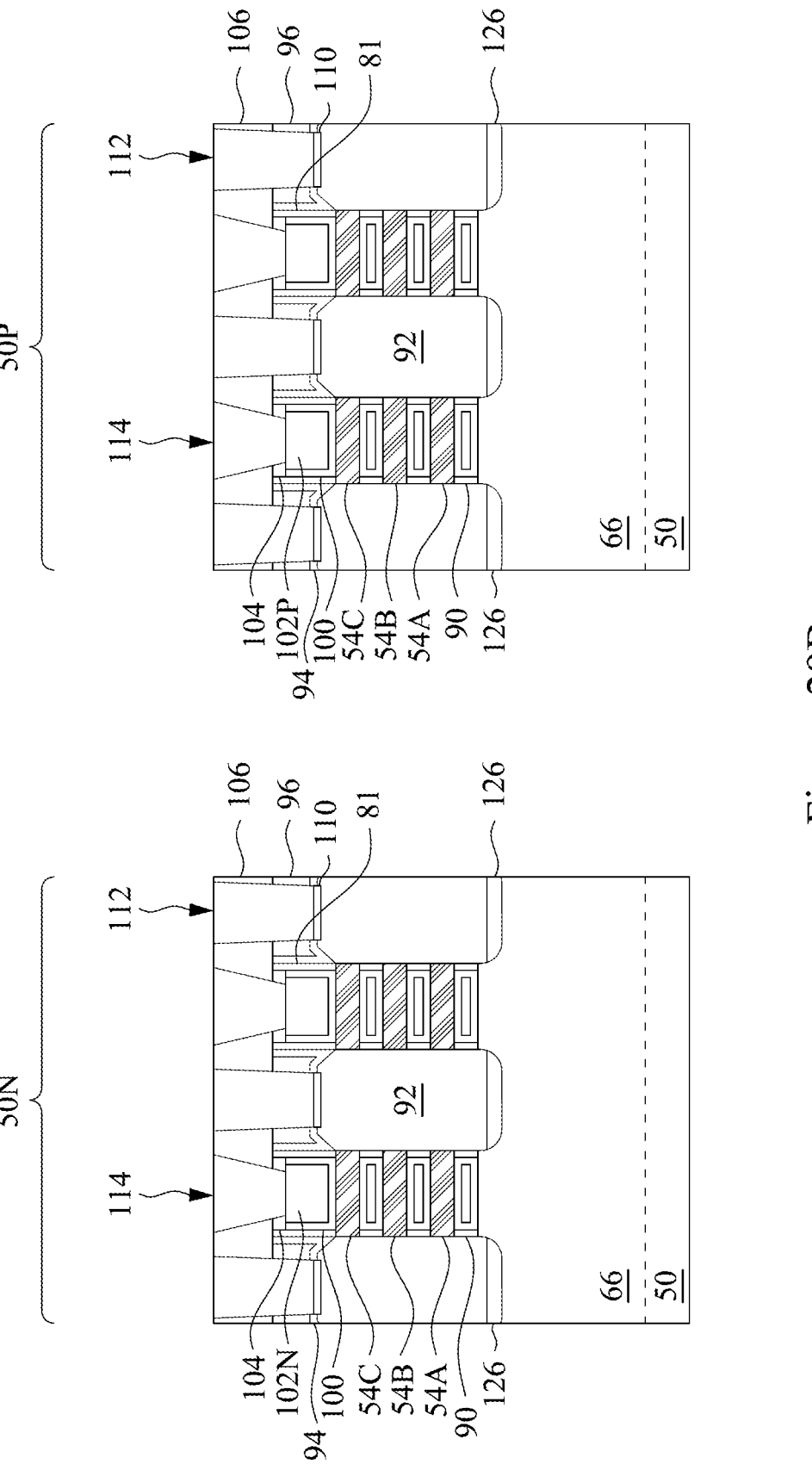
Figure 29C:
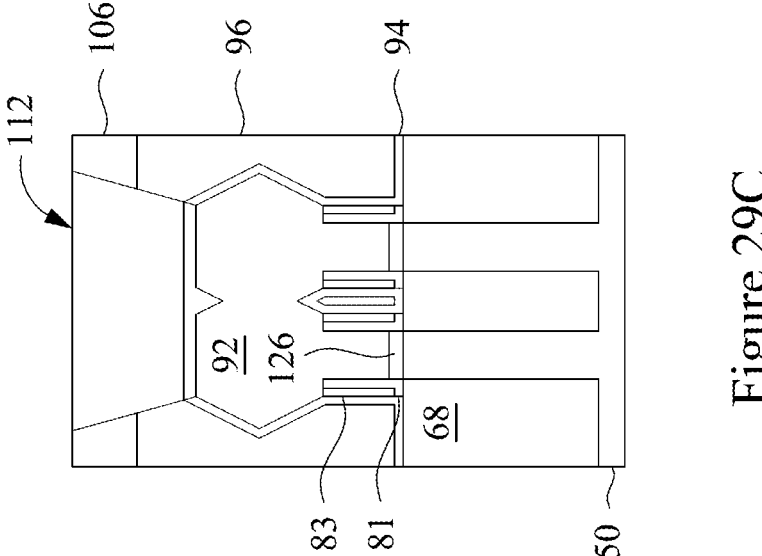

In still other embodiments, the first semiconductor layers 51 may be removed and the second semiconductor layers 53 may be patterned to form channel regions of nano-FETS in both the n-type region 50N and the p-type region 50P. In other embodiments, the second semiconductor layers 53 may be removed and the first semiconductor layers 51 may be patterned to form channel regions of nano-FETs in both the n-type region 50N and the p-type region 50P. In such embodiments, the channel regions in both the n-type region 50N and the p-type region 50P may have a same material composition (e.g., silicon, or the another semiconductor material) and be formed simultaneously. FIGS. 29A, 29B, and 29C illustrate a structure resulting from such embodiments where the channel regions in both the p-type region 50P and the n-type region 50N comprise silicon, for example.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium, or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high-etch selectivity to one another. As such, the first semiconductor layers 51 of the first semiconductor material may be removed without significantly removing the second semiconductor layers 53 of the second semiconductor material in the n-type region 50N, thereby allowing the second semiconductor layers 53 to be patterned to form channel regions of n-type nano-FETs. Similarly, the second semiconductor layers 53 of the second semiconductor material may be removed without significantly removing the first semiconductor layers 51 of the first semiconductor material in the p-type region 50P, thereby allowing the first semiconductor layers 51 to be patterned to form channel regions of p-type nano-FETs.

Figure 9:
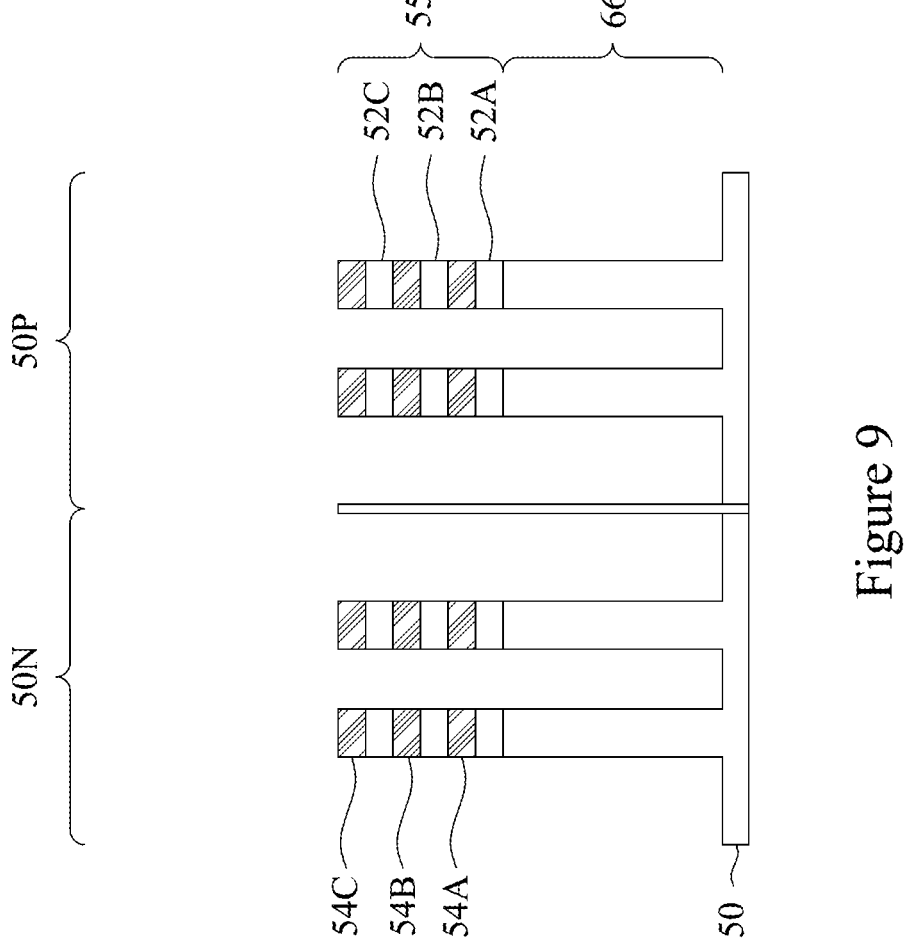

Referring now to FIG. 9, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-C (collectively referred to as the first nanostructures 52) from the first semiconductor layers 51 and define second nanostructures 54A-C (collectively referred to as the second nanostructures 54) from the second semiconductor layers 53. The first nanostructures 52 and the second nanostructures 54 may further be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 9 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 10:
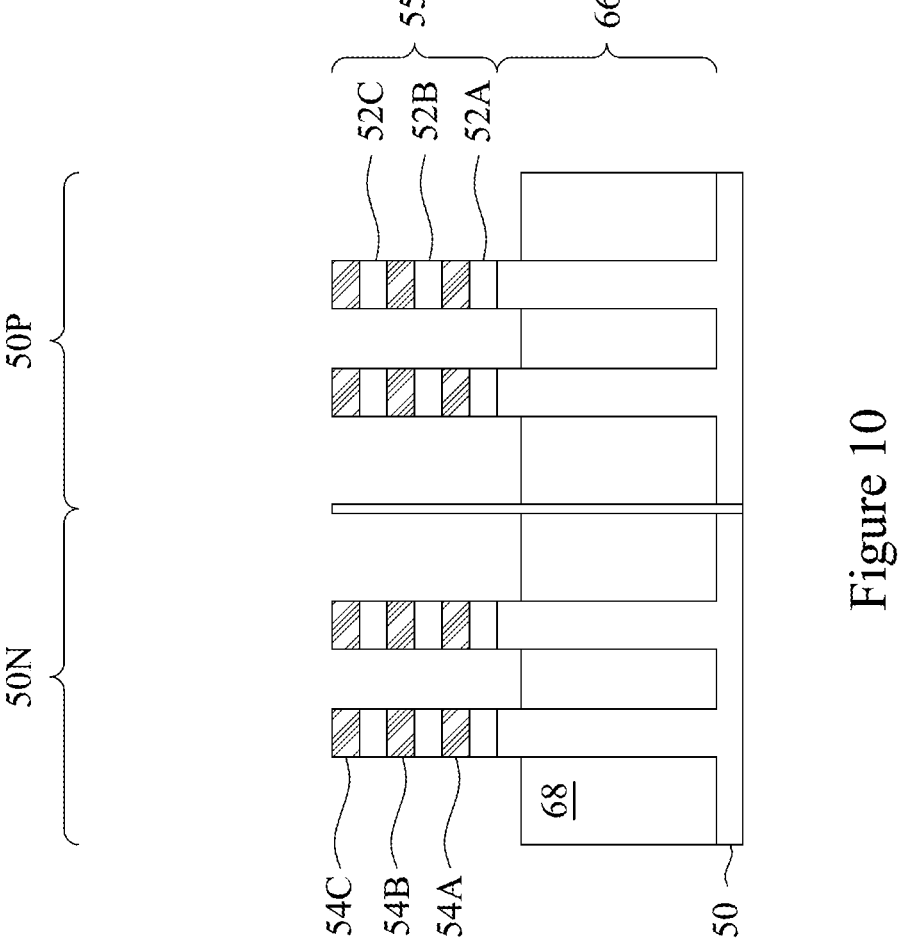

In FIG. 10, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the n-type region 50N and the p-type region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 8 through 10 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting nanostructures 52) and the second semiconductor layers 53 (and resulting nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 10, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 11:
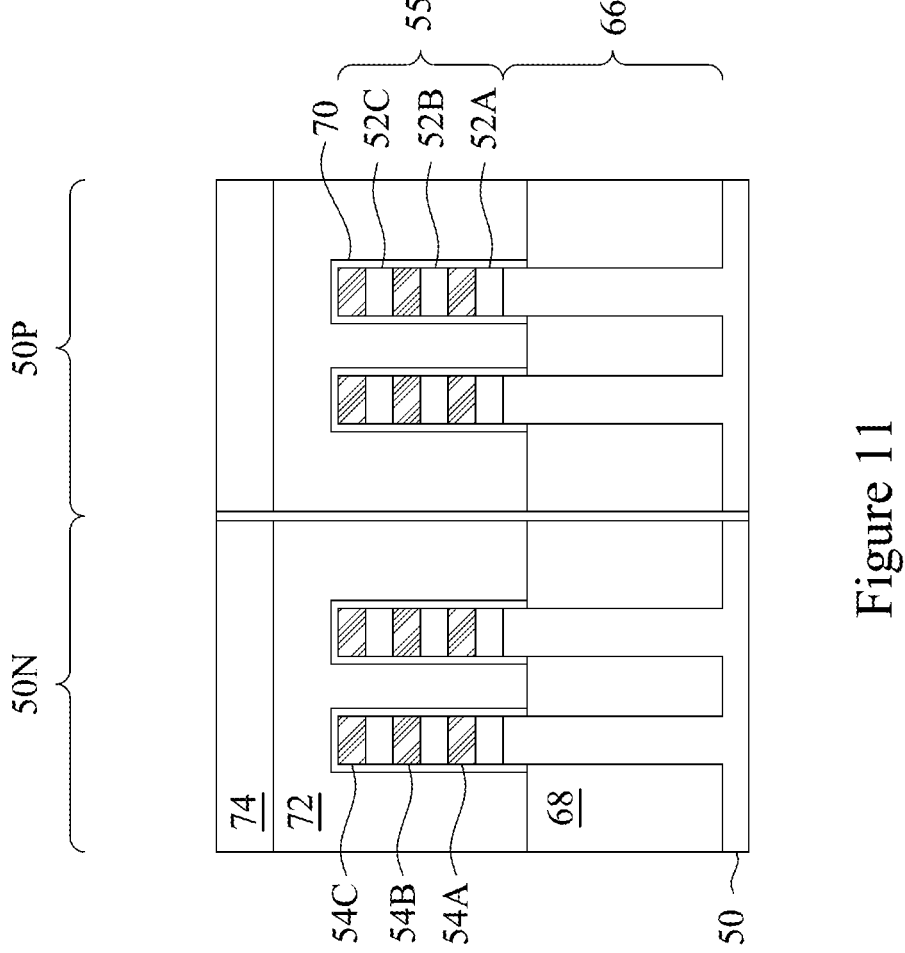

In FIG. 11, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions 68. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 12A:
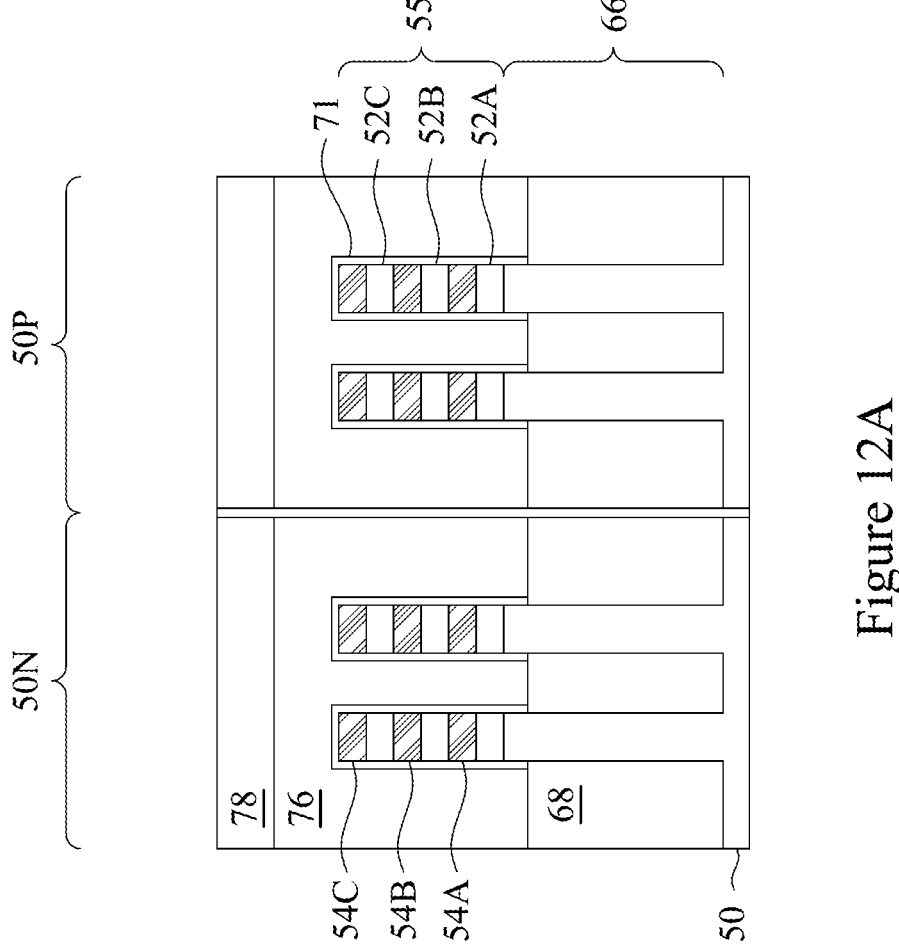
Figure 12B:
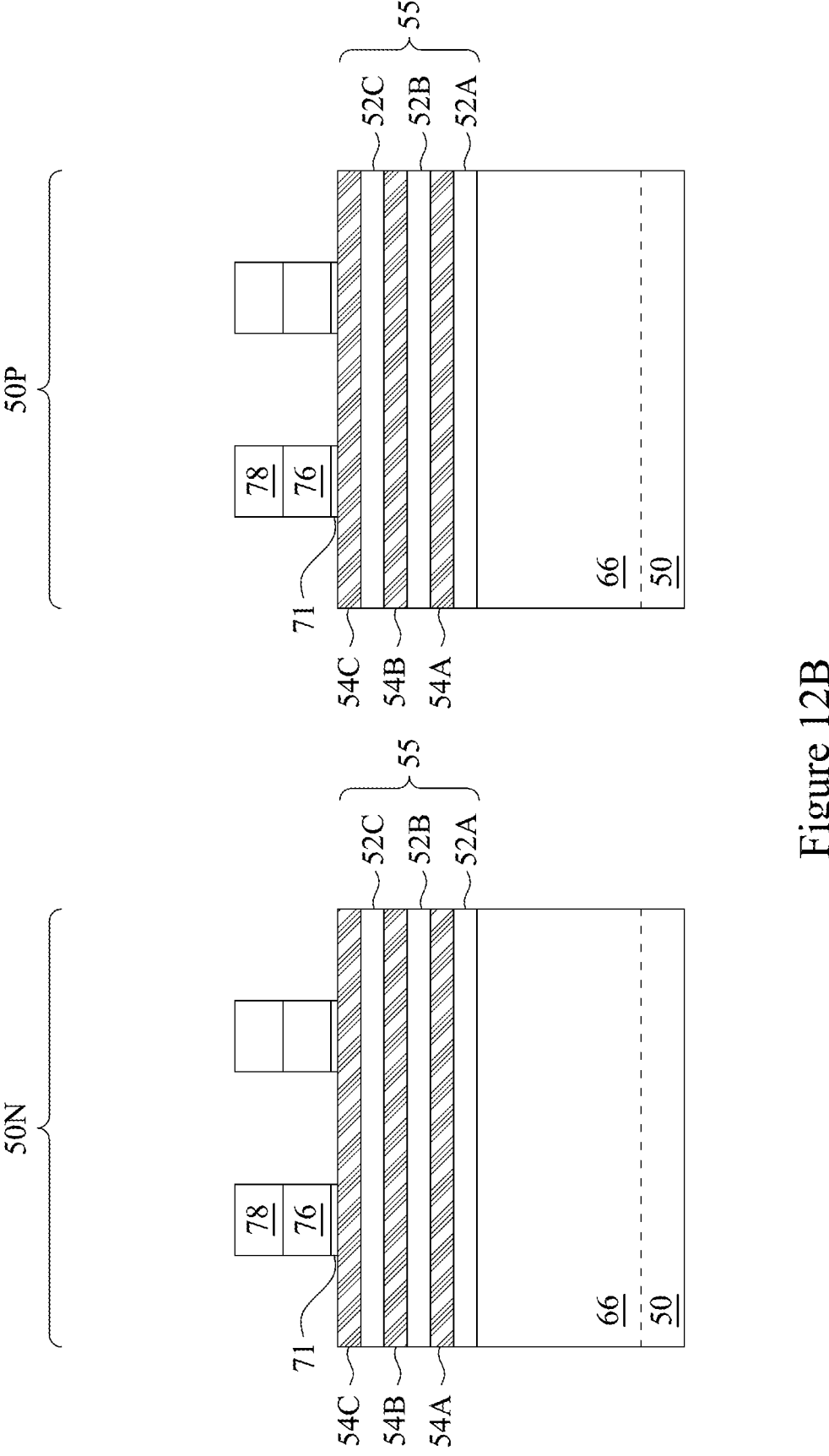

FIGS. 12A through 26C illustrate various additional steps in the manufacturing of embodiment devices. FIGS. 12A, 13A, 14A, 15A, 16A, 17A, 18A, 19A, 20A, 20C, 21A, 21C, 22A, 23A, and 26C illustrate features in either the regions 50N or the regions 50P. In FIGS. 12A and 12B, the mask layer 74 (see FIG. 11) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66. The dummy gate dielectrics 71, dummy gates 76, and masks 78 may collectively be referred to as a "dummy gate structure."

Figure 13A:
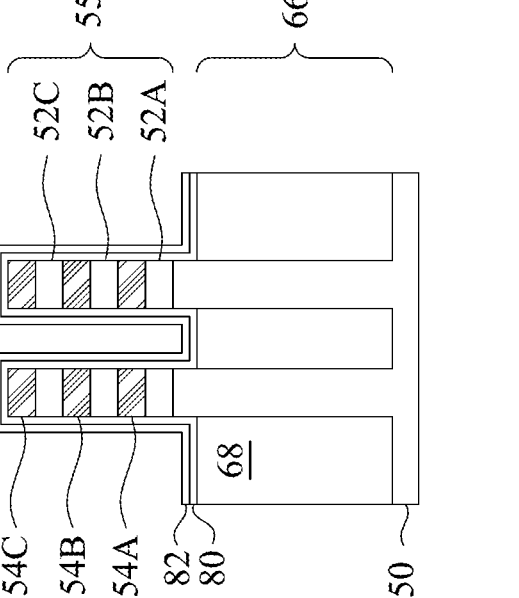
Figure 13B:
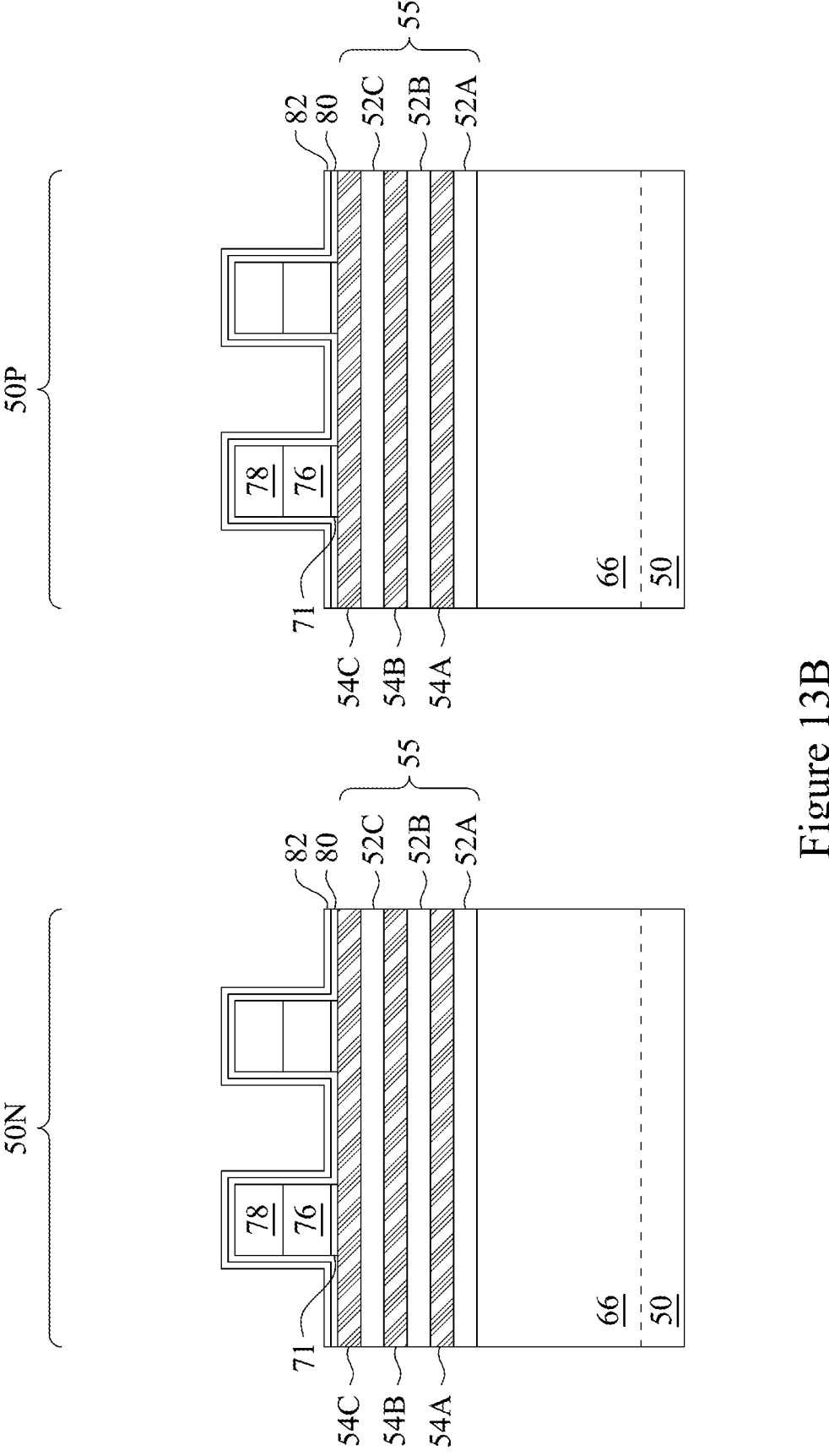

In FIGS. 13A and 13B, a first spacer layer 80 and a second spacer layer 82 are formed over the structures illustrated in FIGS. 12A and 12B, respectively. The first spacer layer 80 and the second spacer layer 82 will be subsequently patterned to act as spacers for forming self-aligned source/drain regions. In FIGS. 13A and 13B, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 10, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/cm$^3$ to about $1\times10^{19}$ atoms/cm$^3$. An anneal may be used to repair implant damage and to activate the implanted impurities.

Figure 14A:
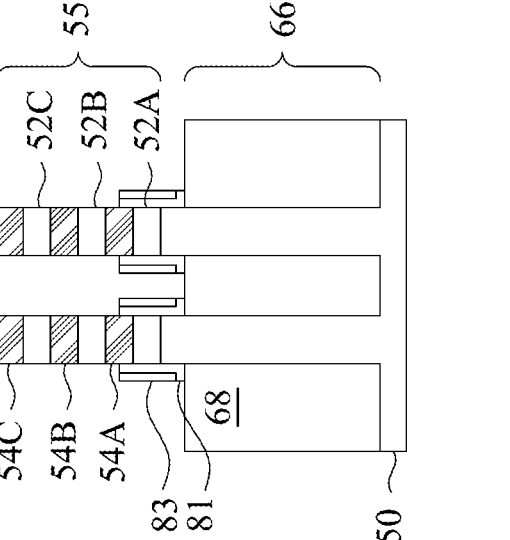
Figure 14B:
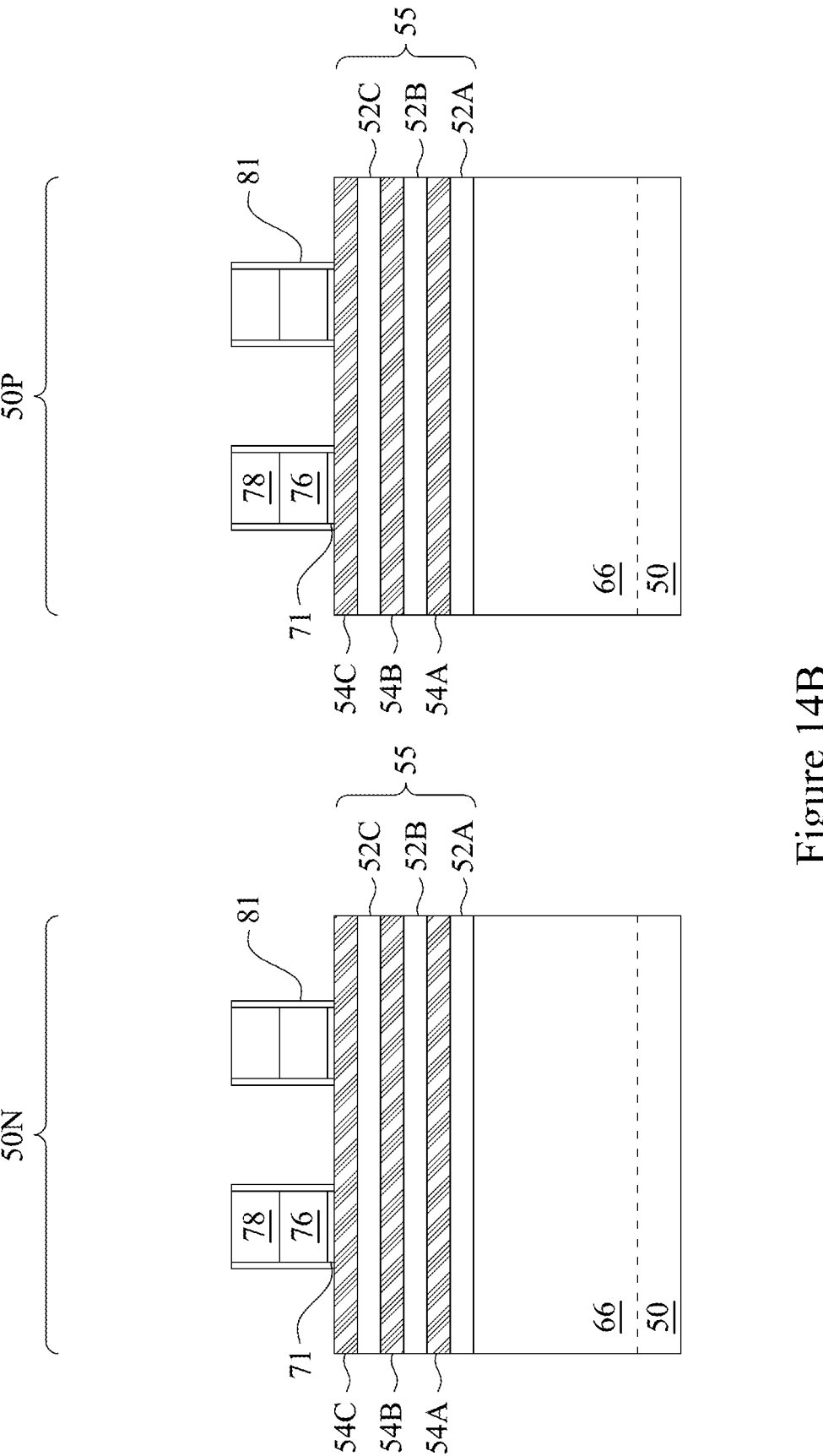

In FIGS. 14A and 14B, the first spacer layer 80 and the second spacer layer 82 are etched to form first spacers 81 and second spacers 83. As will be discussed in greater detail below, the first spacers 81 and the second spacers 83 act to self-aligned subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 14A. Thereafter, the second spacers 83 acts as a mask while etching exposed portions of the first spacer layer 80, thereby forming first spacers 81 as illustrated in FIG. 14A.

As illustrated in FIG. 14A, the first spacers 81 and the second spacers 83 are disposed on sidewalls of the fins 66 and/or nanostructures 55. As illustrated in FIG. 14B, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 71. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 15A:
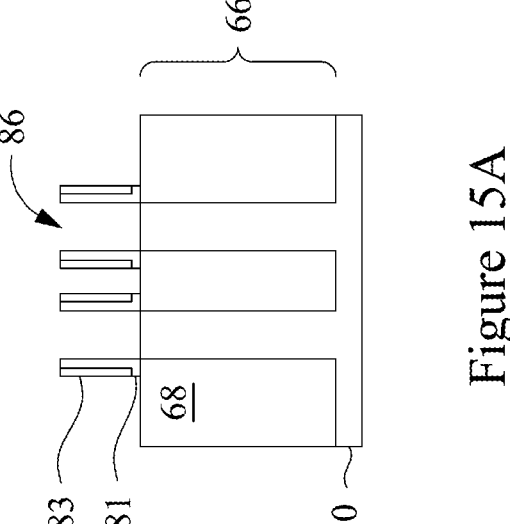
Figure 15B:
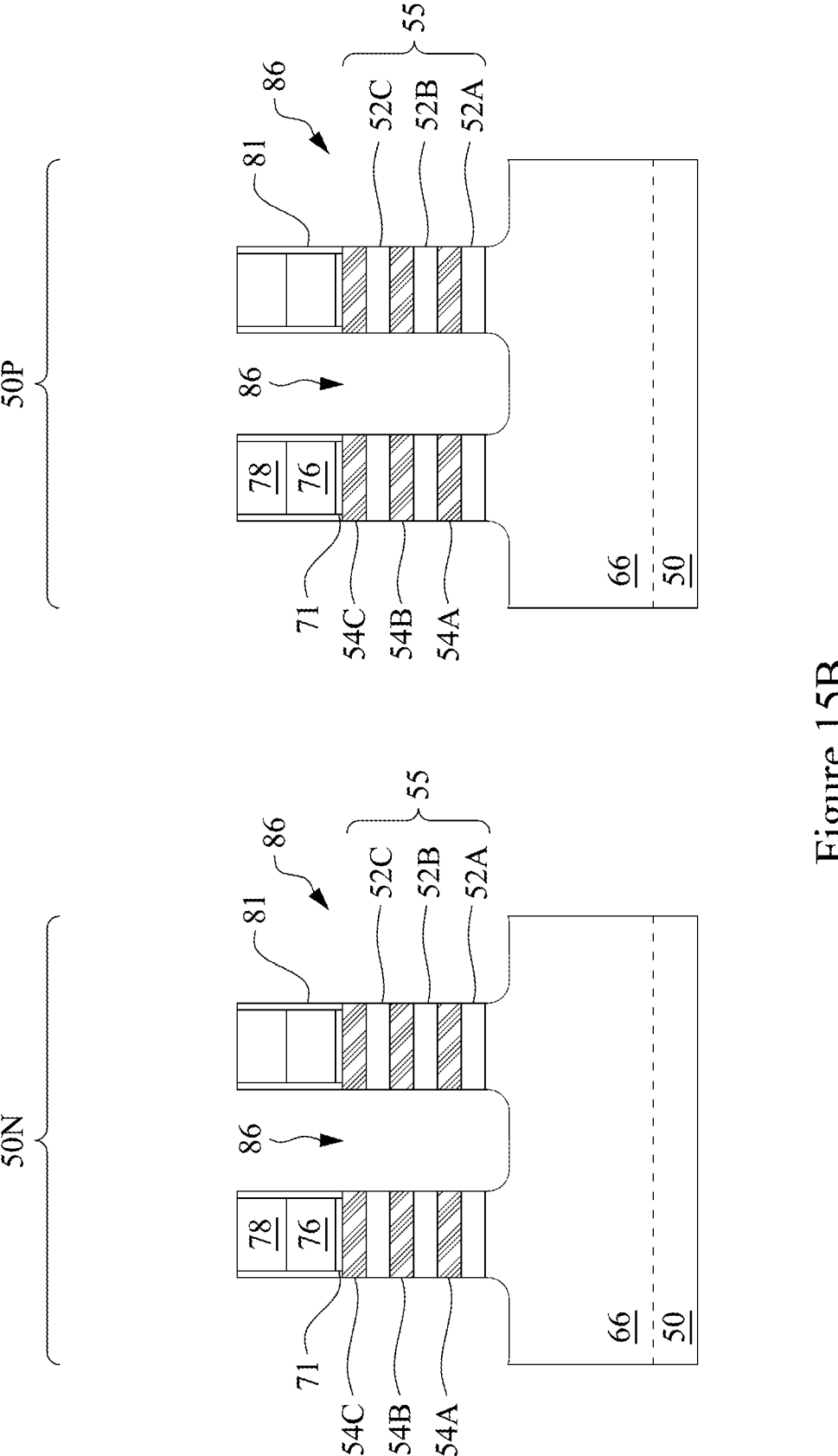

In FIGS. 15A and 15B, first recesses 86 are formed in the fins 66, the nanostructures 55, and the substrate 50, in accordance with some embodiments. Epitaxial source/drain regions will be subsequently formed in the first recesses 86. The first recesses 86 may extend through the first nanostructures 52 and the second nanostructures 54, and into the substrate 50. As illustrated in FIG. 15A, top surfaces of the STI regions 68 may be level with bottom surfaces of the first recesses 86. In various embodiments, the fins 66 may be etched such that bottom surfaces of the first recesses 86 are disposed below the top surfaces of the STI regions 68; or the like. The first recesses 86 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86. A single etch process or multiple etch processes may be used to etch each layer of the nanostructures 55 and/or the fins 66. Timed etch processes may be used to stop the etching of the first recesses 86 after the first recesses 86 reach a desired depth.

Figure 16A:
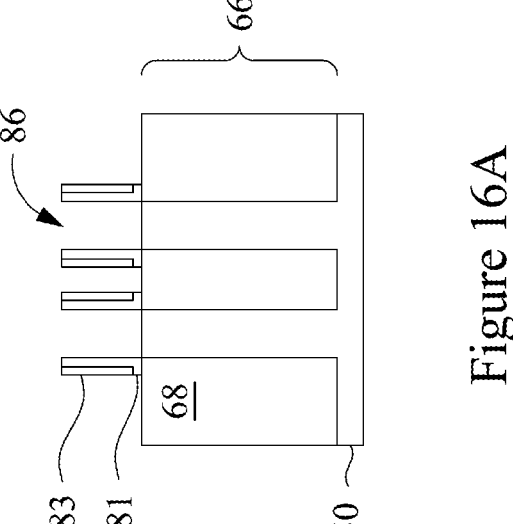
Figure 16B:
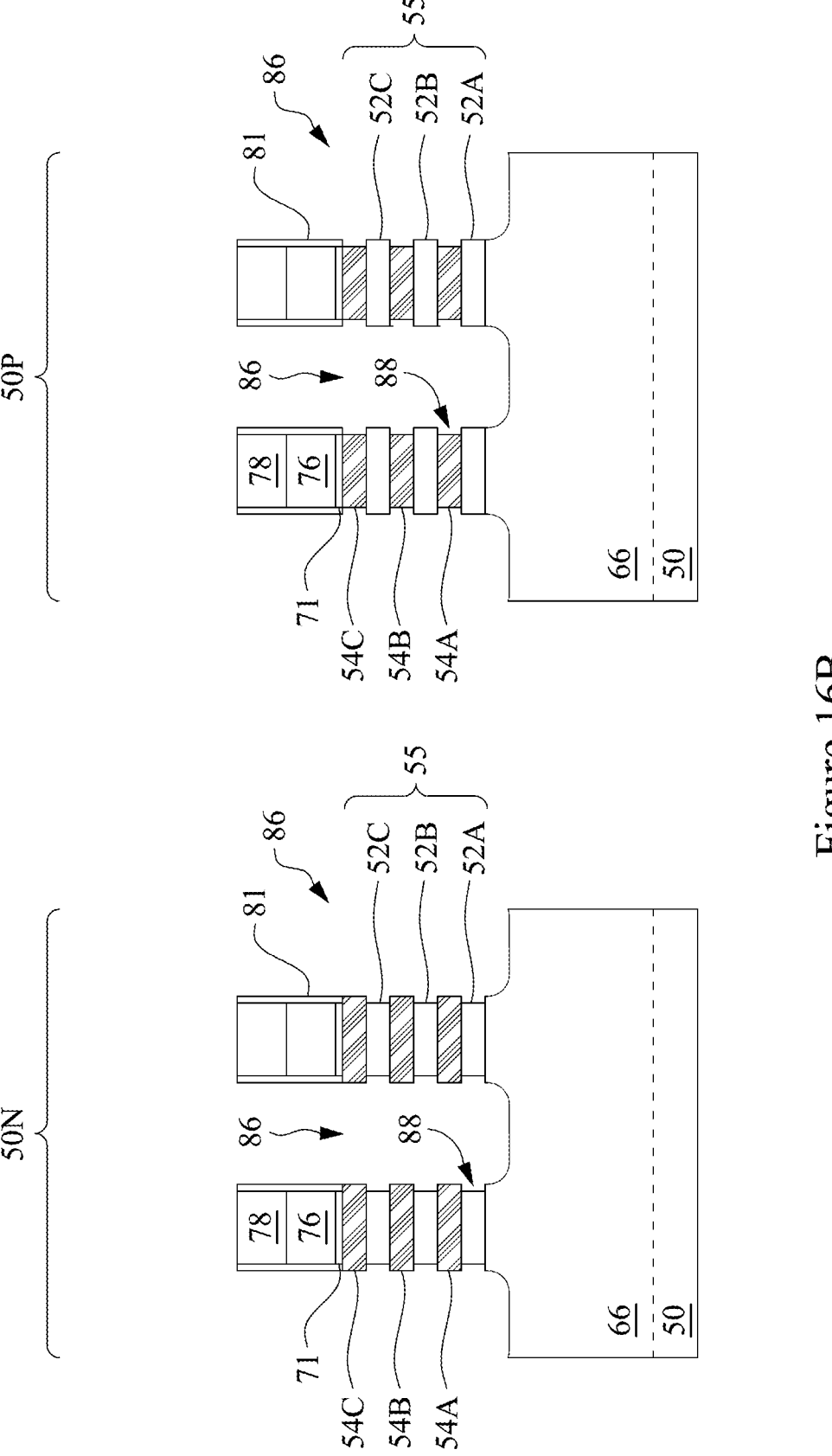

In FIGS. 16A and 16B, portions of sidewalls of the layers of the multi-layer stack 64 formed of the first semiconductor materials (e.g., the first nanostructures 52) exposed by the first recesses 86 are etched to form sidewall recesses 88 in the n-type region 50N, and portions of sidewalls of the layers of the multi-layer stack 64 formed of the second semiconductor materials (e.g., the second nanostructures 54) exposed by the first recesses 86 are etched to form sidewall recesses 88 in the p-type region 50P. Although sidewalls of the first nanostructures 52 and the second nanostructures 54 in sidewall recesses 88 are illustrated as being straight in FIG. 16B, the sidewalls may be concave or convex. The sidewalls may be etched using isotropic etching processes, such as wet etching or the like. The p-type region 50P may be protected using a mask (not shown) while etchants selective to the first semiconductor materials are used to etch the first nanostructures 52 such that the second nanostructures 54 and the substrate 50 remain relatively unetched as compared to the first nanostructures 52 in the n-type region 50N. Similarly, the n-type region 50N may be protected using a mask (not shown) while etchants selective to the second semiconductor materials are used to etch the second nanostructures 54 such that the first nanostructures 52 and the substrate 50 remain relatively unetched as compared to the second nanostructures 54 in the p-type region 50P. In an embodiment in which the first nanostructures 52 include, e.g., SiGe, and the second nanostructures 54 include, e.g., Si or SiC, a dry etch process with tetramethylammonium hydroxide (TMAH), ammonium hydroxide (NH$_4$OH), or the like may be used to etch sidewalls of the first nanostructures 52 in the n-type region 50N, and a wet or dry etch process with hydrogen fluoride, another fluorine-based etchant, or the like may be used to etch sidewalls of the second nanostructures 54 in the p-type region 50P.

Figure 17A:
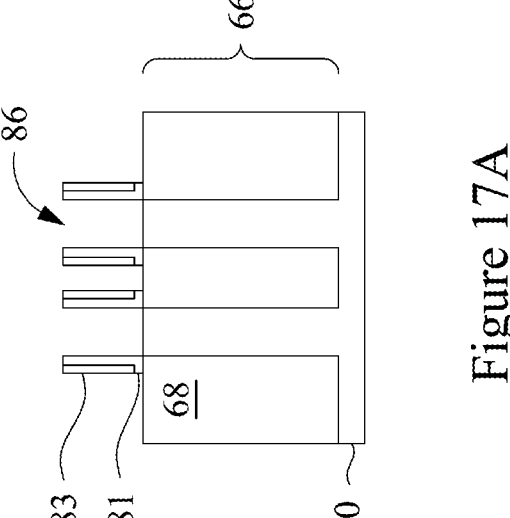
Figure 17B:
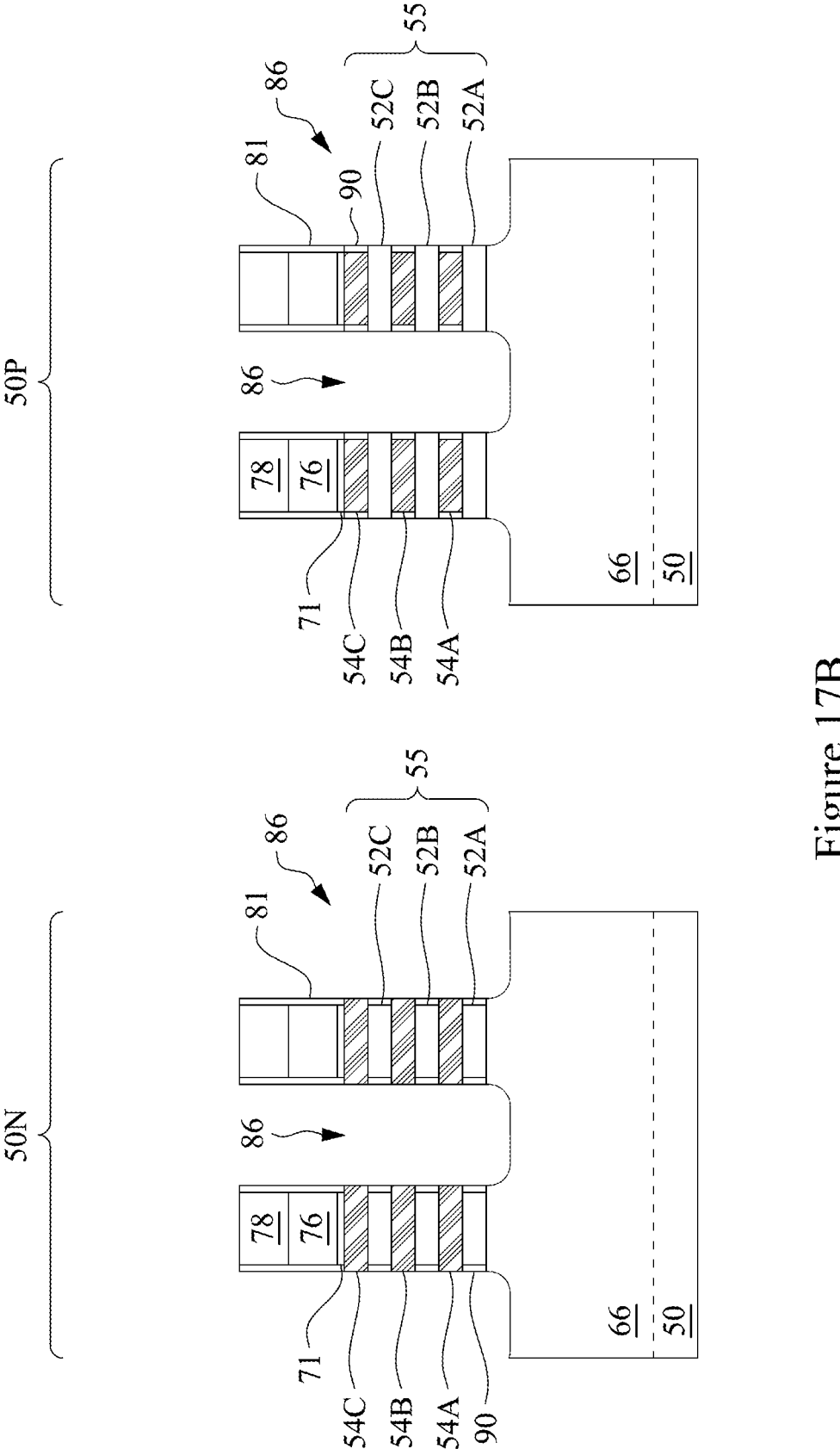
Figure 17C:
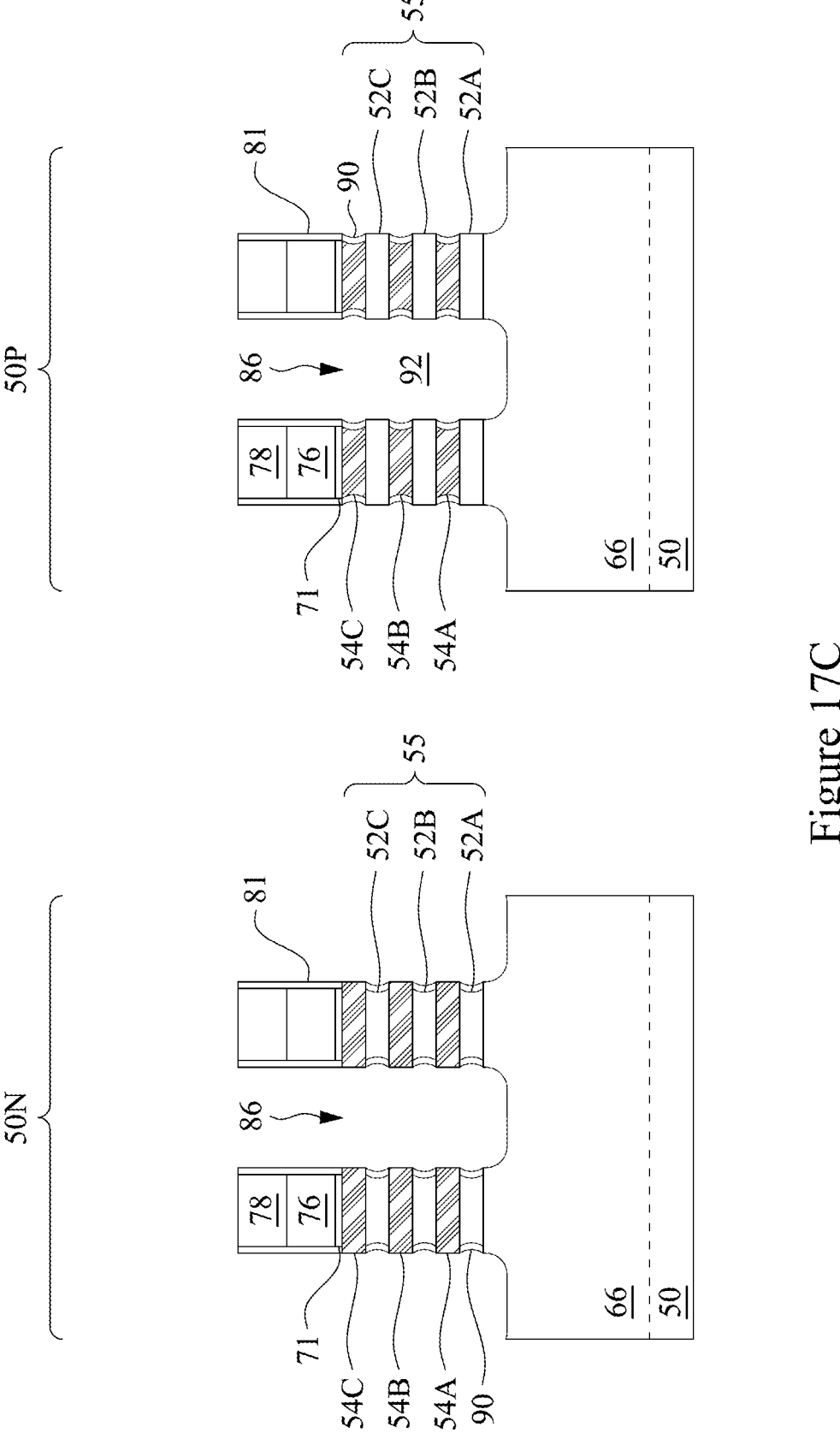

In FIGS. 17A-17C, first inner spacers 90 are formed in the sidewall recess 88. The first inner spacers 90 may be formed by depositing an inner spacer layer (not separately illustrated) over the structures illustrated in FIGS. 16A and 16B. The first inner spacers 90 act as isolation features between subsequently formed source/drain regions and a gate structure. As will be discussed in greater detail below, source/drain regions will be formed in the recesses 86, while the first nanostructures 52 in the n-type region 50N and the second nanostructures 54 in the p-type region 50P will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54 in the n-type region 50N and flush with the sidewalls of the first nanostructures 52 in the p-type region 50P, the outer sidewalls of the first inner spacers 90 may extend beyond or be recessed from sidewalls of the second nanostructures 54 and/or the first nanostructures 52, respectively.

Moreover, although the outer sidewalls of the first inner spacers 90 are illustrated as being straight in FIG. 17B, the outer sidewalls of the first inner spacers 90 may be concave or convex. As an example, FIG. 17C illustrates an embodiment in which sidewalls of the first nanostructures 52 are concave, outer sidewalls of the first inner spacers 90 are concave, and the first inner spacers 90 are recessed from sidewalls of the second nanostructures 54 in the n-type region 50N. Also illustrated are embodiments in which sidewalls of the second nanostructures 54 are concave, outer sidewalls of the first inner spacers 90 are concave, and the first inner spacers 90 are recessed from sidewalls of the first nanostructures 52 in the p-type region 50P. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 20A-20C) by subsequent etching processes, such as etching processes used to form gate structures.

FIGS. 18A-18B and 19A-19B illustrate the formation of the isolation layer 126 in the first recesses 86, in accordance with some embodiments. The isolation layer 126 may be formed using a bottom-up deposition technique similar to that described previously for FIGS. 1-6. For example, the isolation layer 126 may be formed using a PECVD process or a PEALD process that utilizes a repulsive material (e.g., repulsive material 120 in FIG. 18B). The isolation layer 126 may be formed to electrically isolate the subsequently-formed source/drain regions 92 (see FIGS. 20A-20C), which can reduce leakage and improve device performance. In some embodiments, the isolation layer 126 comprises a material such as silicon oxide, silicon nitride, silicon oxynitride, silicon carbide, silicon carbonitride, the like, or a combination thereof. Other materials are possible. In some embodiments, the isolation layer 126 may be formed having a thickness in the range of about 2 nm to about 8 nm, though other thicknesses are possible.

Figure 18A:
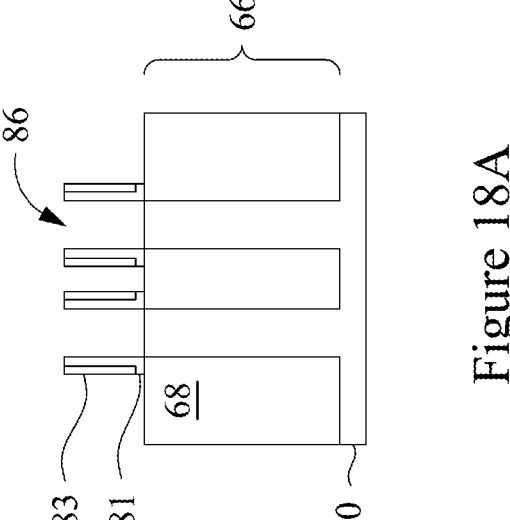
Figure 18B:
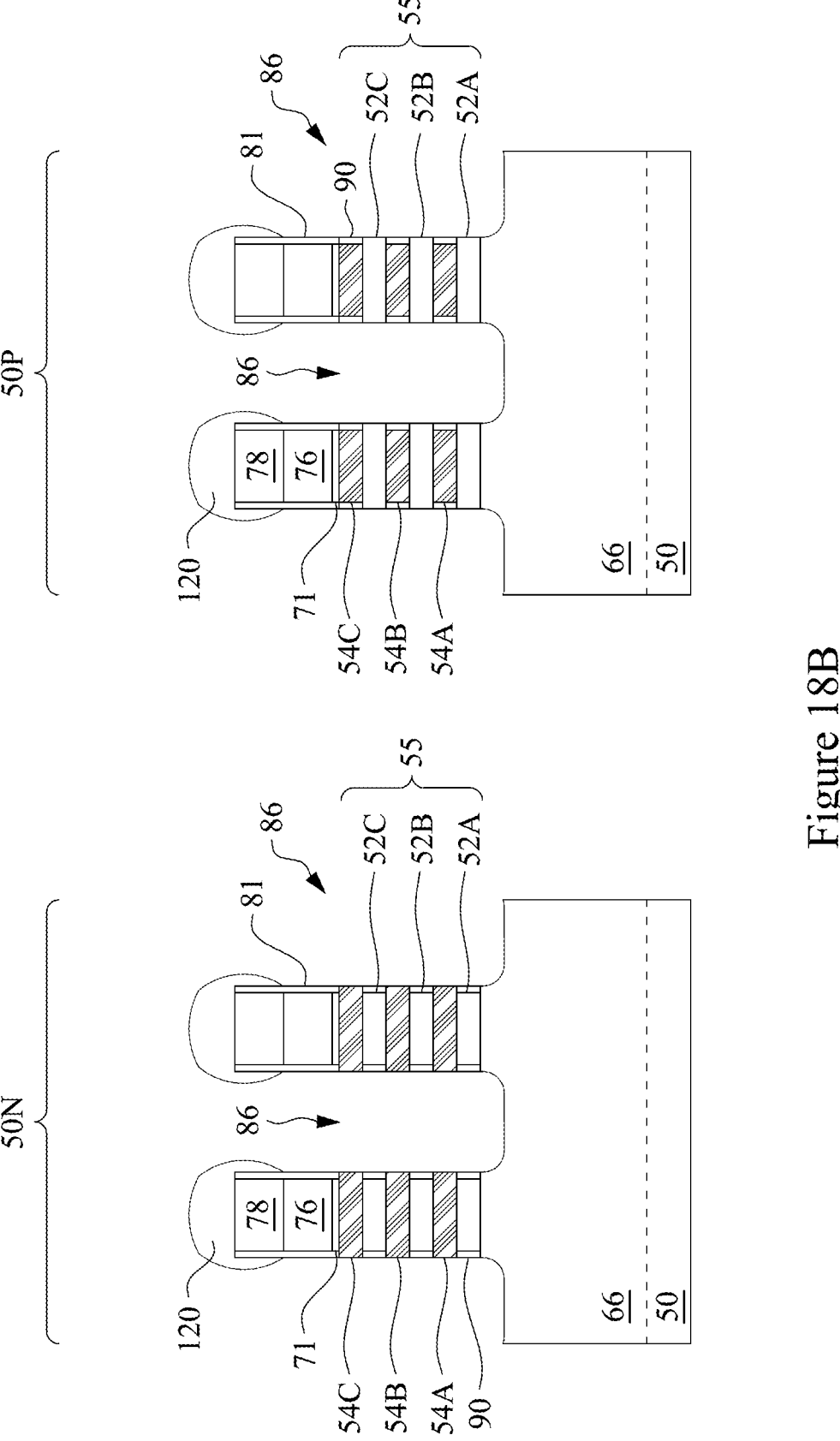

In FIGS. 18A-18B, a repulsive material 120 is deposited on the first spacers 81 and the masks 78, in accordance with some embodiments. The repulsive material 120 may be similar to the repulsive material 20 described previously for FIG. 2, and may be formed using similar techniques. For example, the repulsive material 120 may be titanium nitride deposited using a PVD technique, though other materials or techniques are possible. In some embodiments, an optional etching process is performed to remove the repulsive material from bottom surfaces and/or sidewall surfaces of the first recesses 86. The etching process may be similar to the etching process described previously for FIG. 3. After performing the etching process, portions of the repulsive material 20 may remain on surfaces of the first spacers 81 and/or the masks 78. Similar to the repulsive material 20 described for FIG. 2, the repulsive material 120 is formed to converge a plasma within the first recesses 86 during a plasma-assisted deposition process.

Figure 19A:
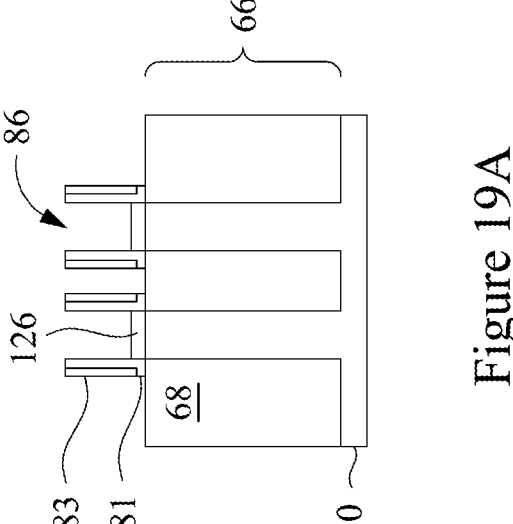
Figure 19B:
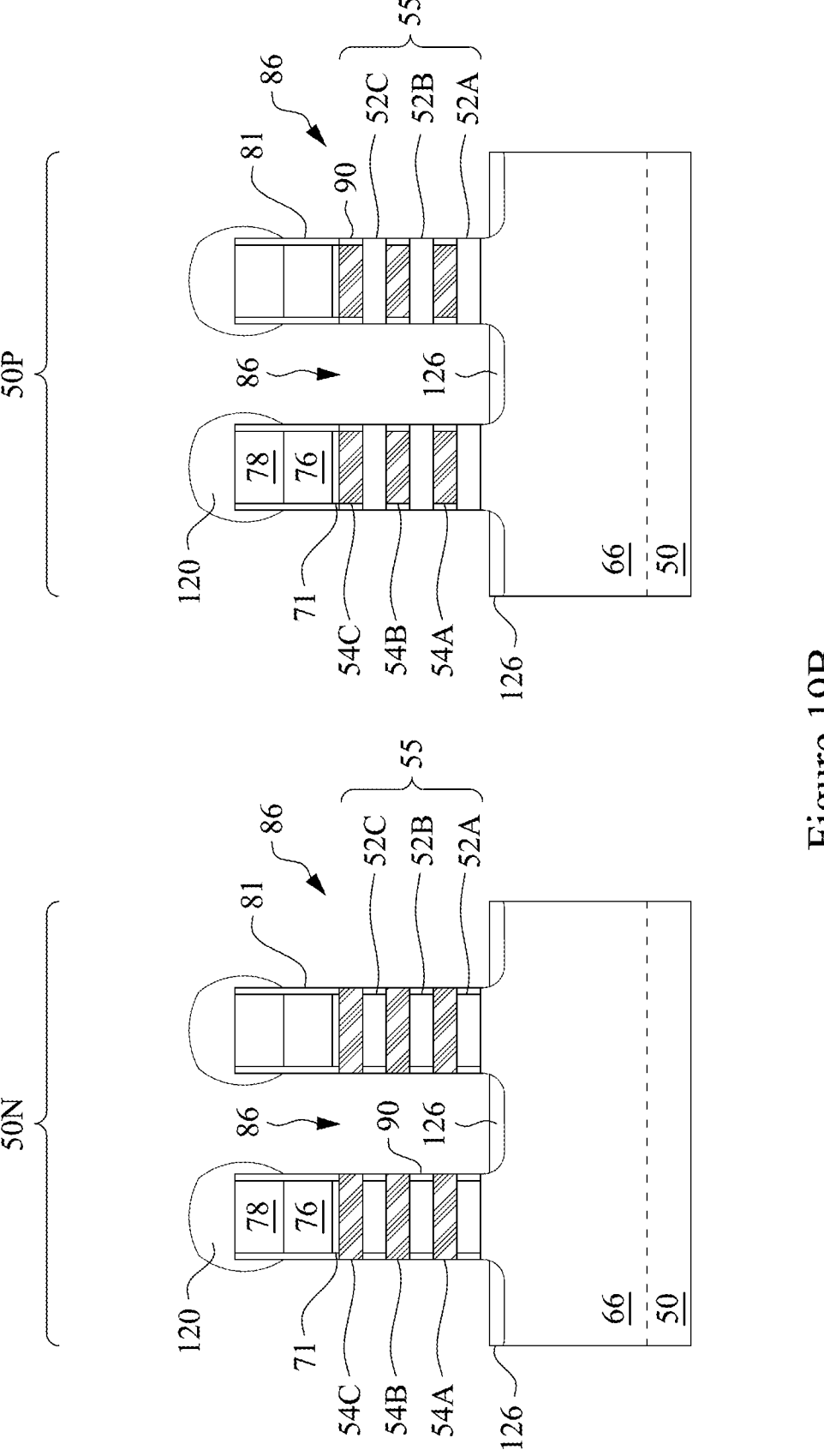

In FIGS. 19A-19B, the isolation layer 126 is deposited in the first recesses 86, in accordance with some embodiments. The isolation layer 126 may be similar to the material 26 described previously for FIGS. 4-6, and may be formed using similar techniques. For example, the isolation layer 126 may be bottom-up deposited using a plasma-assisted deposition technique such as PECVD or PEALD. The deposition of the isolation layer 126 may comprise performing multiple deposition cycles, and the presence of the repulsive material 120 may converge the plasma into the first recesses 86 during plasma-assisted steps of the deposition cycles. In this manner, the isolation layer 126 may be deposited with little or no seams or voids. Reducing or eliminating seams or voids can improve the quality (e.g., reduce defect formation) of the overlying source/drain regions 92, described below.

Figure 20A:
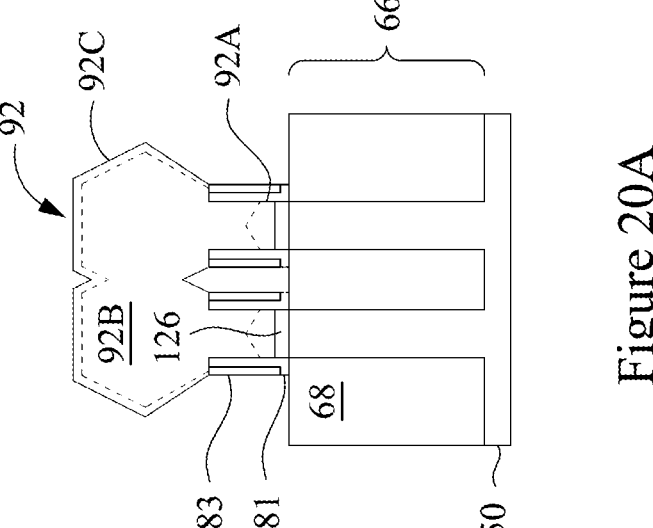
Figure 20B:
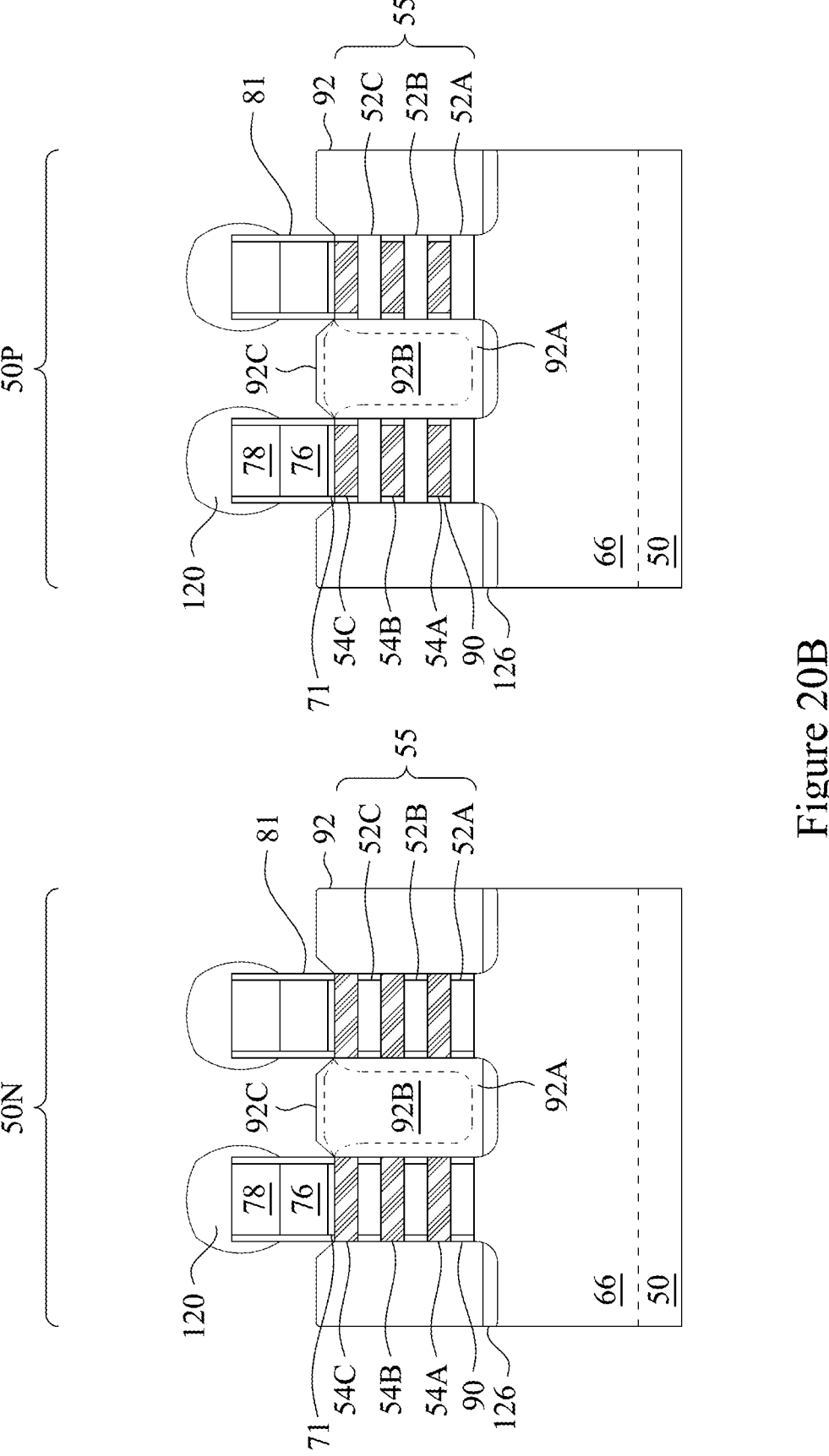
Figure 20C:
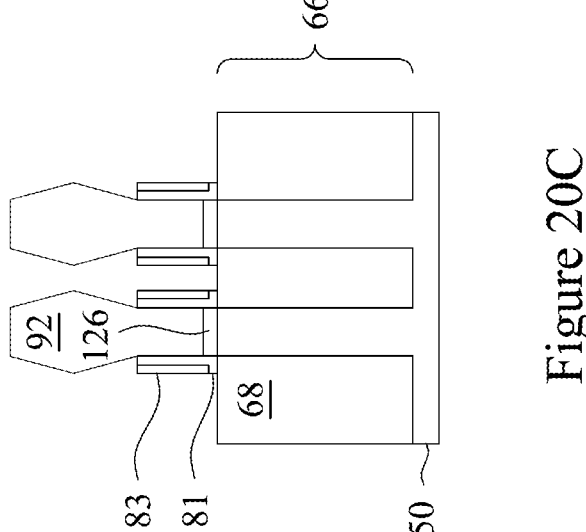

In FIGS. 20A-20C, epitaxial source/drain regions 92 are formed in the first recesses 86, in accordance with some embodiments. The epitaxial source/drain regions 92 may be formed on the isolation layer 126 within each first recess 86. In some embodiments, the source/drain regions 92 may exert stress on the second nanostructures 54 in the n-type region 50N and on the first nanostructures 52 in the p-type region 50P, thereby improving performance. As illustrated in FIG. 20B, the epitaxial source/drain regions 92 are formed in the first recesses 86 such that each dummy gate 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 in the p-type region 50P. The epitaxial source/drain regions 92 may include any acceptable material appropriate for p-type nano-FETs. For example, if the first nanostructures 52 are silicon germanium, the epitaxial source/drain regions 92 may comprise materials exerting a compressive strain on the first nanostructures 52, such as silicon-germanium, boron doped silicon-germanium, germanium, germanium tin, or the like. The epitaxial source/drain regions 92 may also have surfaces raised from respective surfaces of the multi-layer stack 64 and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1 \times 10^{19}$ atoms/cm$^3$ and about $1 \times 10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same nano-FET to merge as illustrated by FIG. 20A. In other embodiments, adjacent epitaxial source/drain regions 92 remain separated after the epitaxy process is completed as illustrated by FIG. 20C. In the embodiments illustrated in FIGS. 20A and 20C, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 20D:
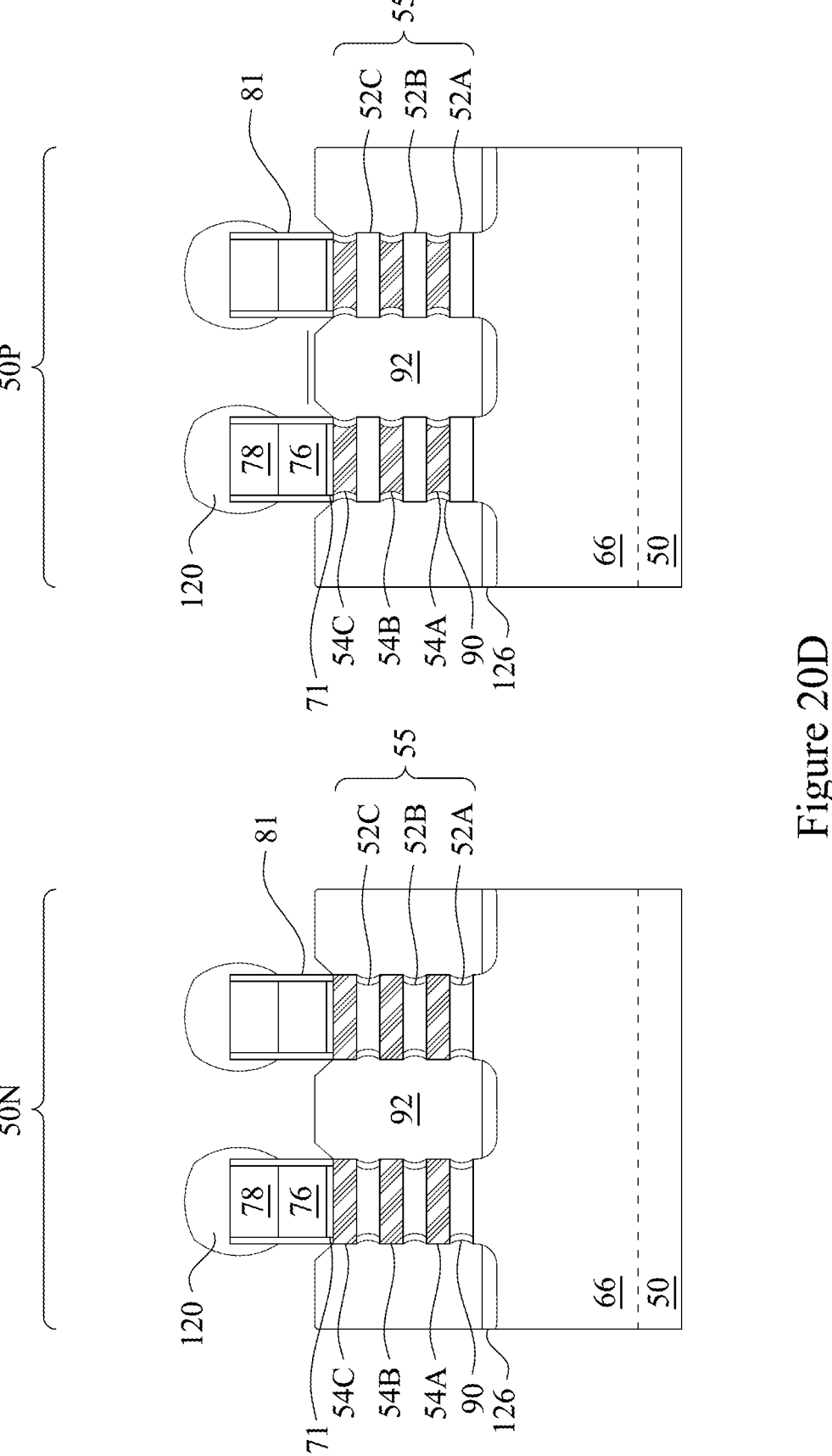

FIG. 20D illustrates an embodiment in which sidewalls of the first nanostructures 52 in the n-type region 50N and sidewalls of the second nanostructures 54 in the p-type region 50P are concave, outer sidewalls of the first inner spacers 90 are concave, and the first inner spacers 90 are recessed from sidewalls of the second nanostructures 54 and the first nanostructures 52, respectively. As illustrated in FIG. 20D, the epitaxial source/drain regions 92 may be formed in contact with the first inner spacers 90 and may extend past sidewalls of the second nanostructures 54 in the n-type region 50N and past sidewalls of the first nanostructures 52 in the p-type region 50P.

Figure 21A:
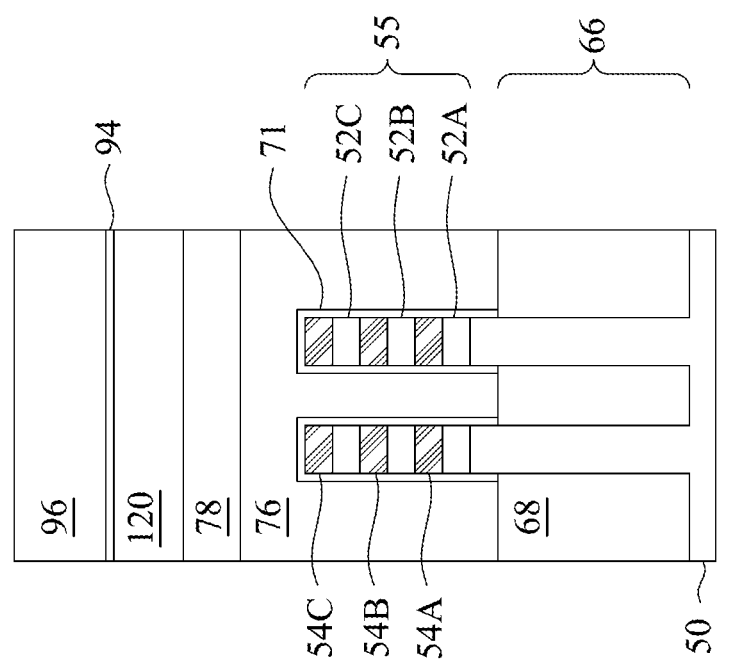
Figure 21B:
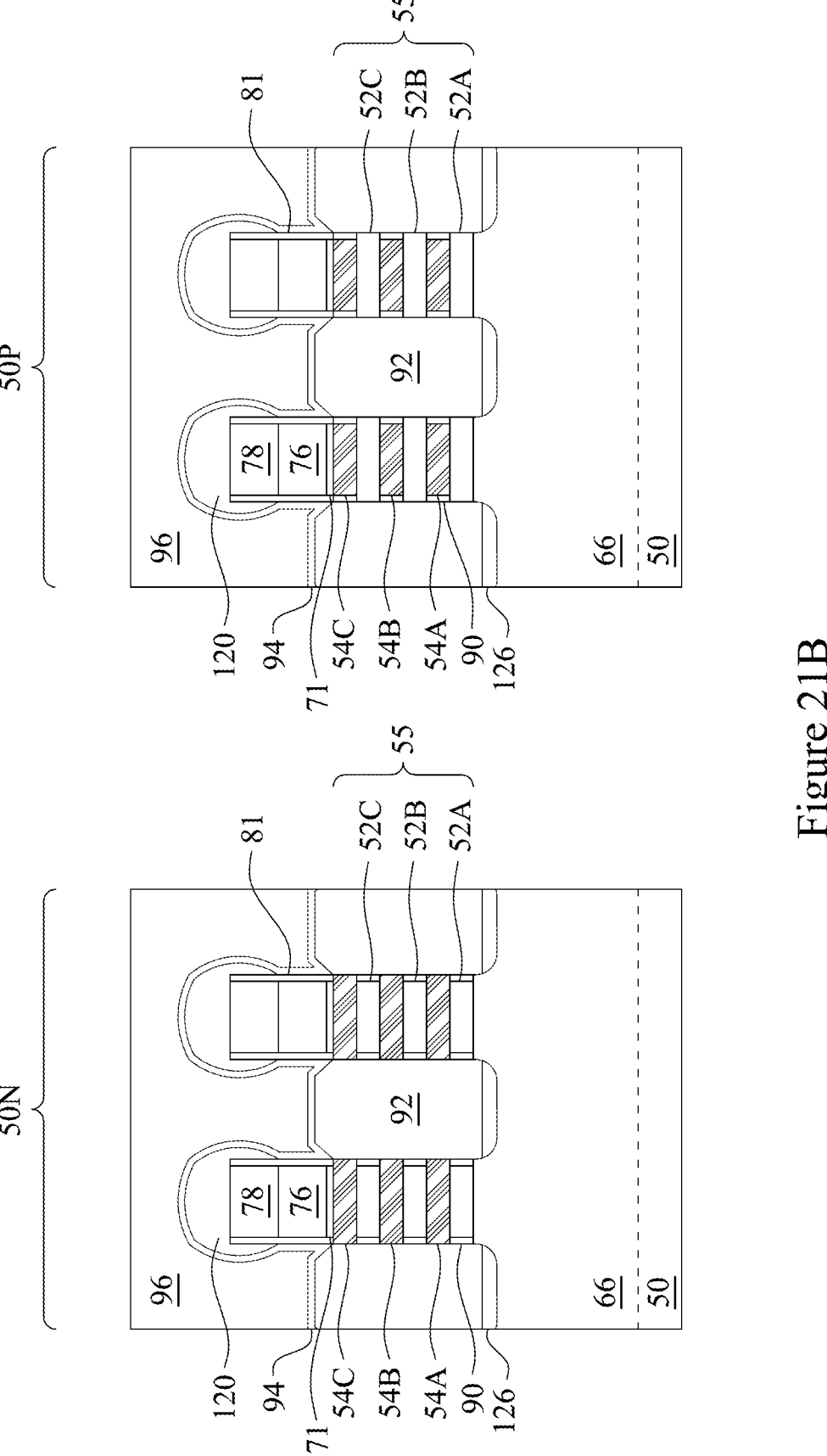
Figure 21C:
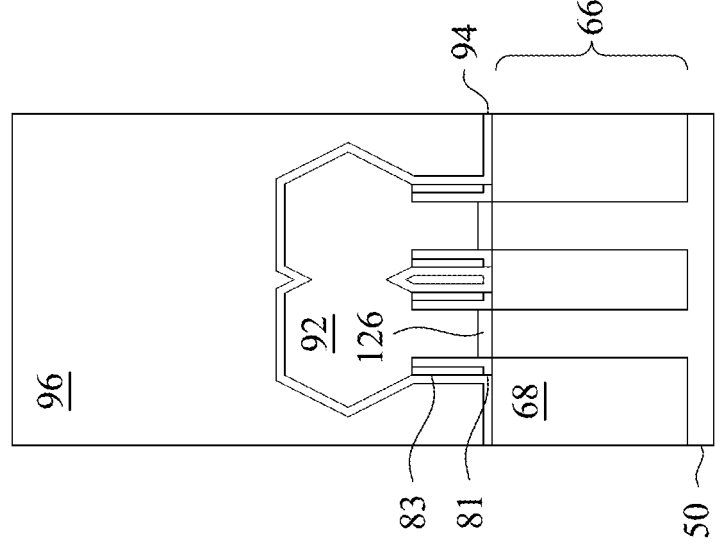

In FIGS. 21A-21C, a first interlayer dielectric (ILD) 96 is deposited over the structure illustrated in FIGS. 12A, 20B, and 20A (the processes of FIGS. 13A-20D do not alter the cross-section illustrated in FIGS. 12A), respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the repulsive material 120, and the first spacers 81. The CESL 94 may comprise a dielectric material, such as, silicon nitride, silicon oxide, silicon oxynitride, or the like, having a different etch rate than the material of the overlying first ILD 96.

Figure 22A:
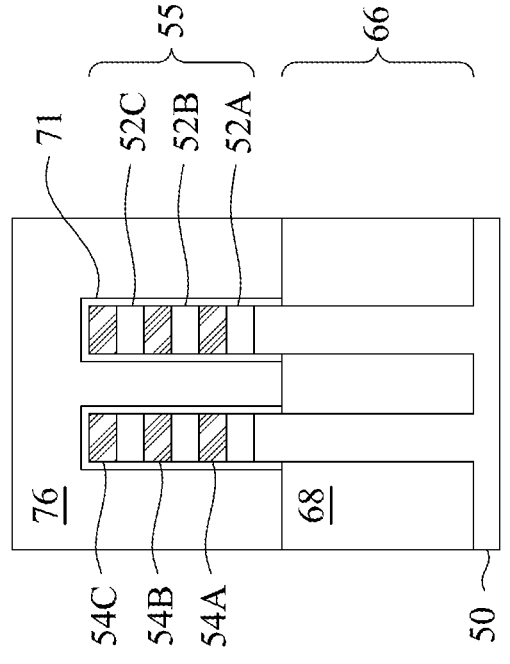
Figure 22B:
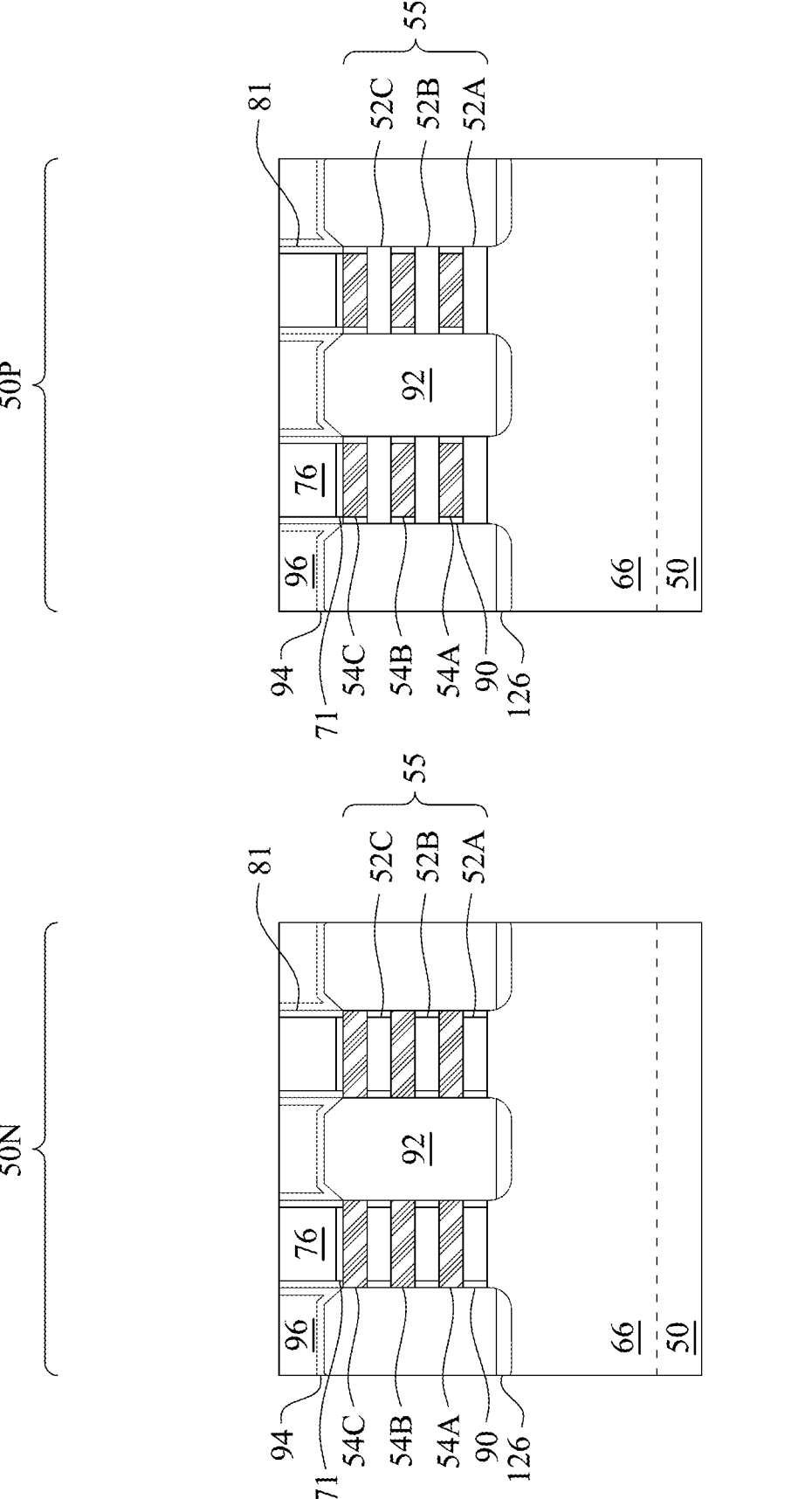

In FIGS. 22A-22B, a planarization process, such as a CMP, may be performed to level the top surface of the first ILD 96 with the top surfaces of the dummy gates 76 or the masks 78. The planarization process may also remove the repulsive material 120, the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with top surfaces of the masks 78 and the first spacers 81. In some embodiments, portions of the repulsive material 120 may remain, in which case the planarization process levels the top surface of the first ILD 96 with a top surface of remaining repulsive material 120.

Figure 23A:
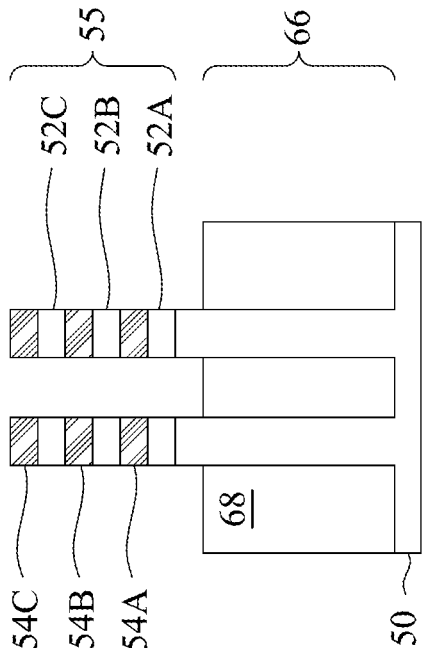
Figure 23B:
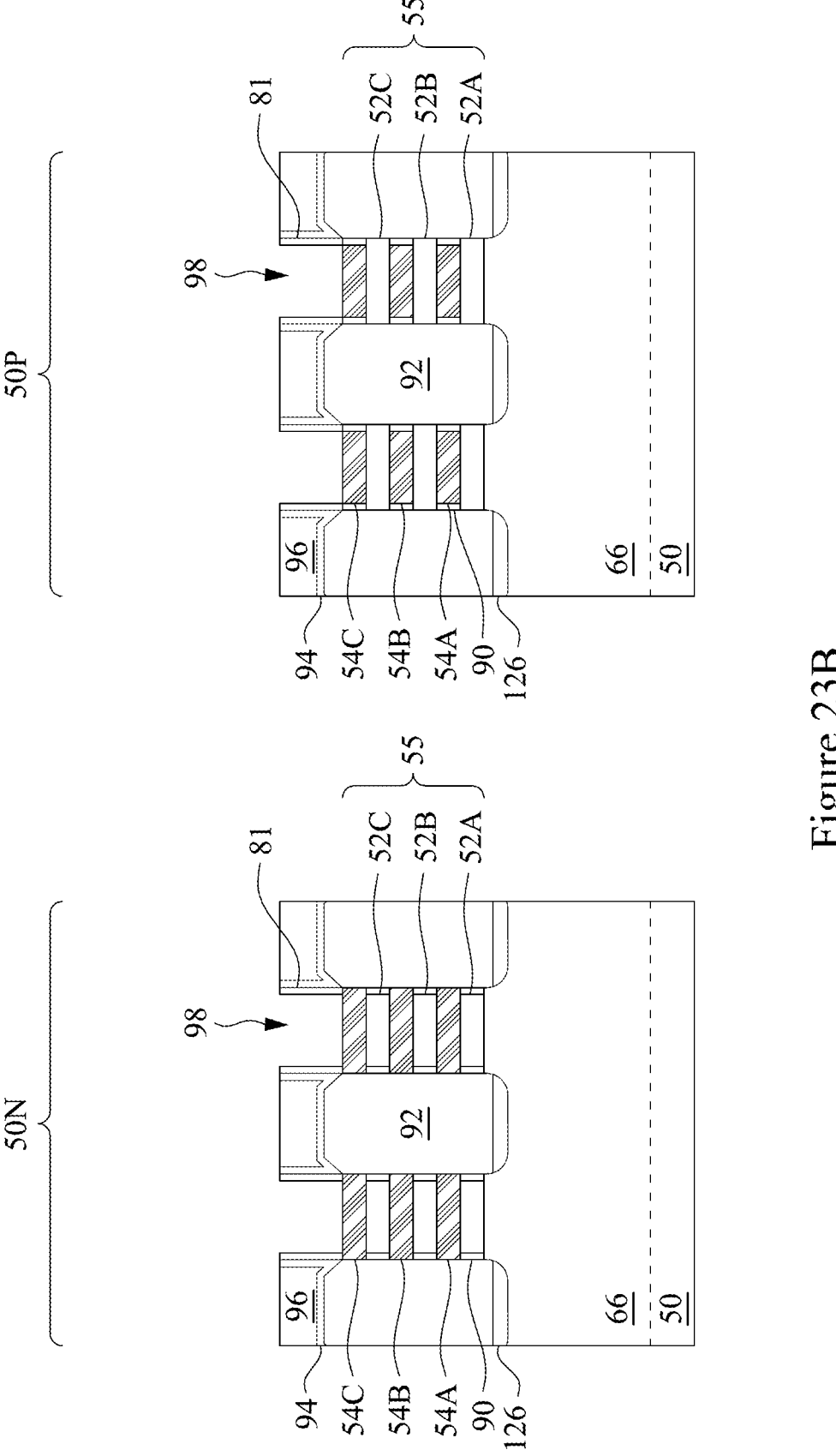

In FIGS. 23A and 23B, the dummy gates 76, and the masks 78 if present, are removed in one or more etching steps, so that second recesses 98 are formed. Portions of the dummy gate dieletrics 71 in the second recesses 98 are also be removed. In some embodiments, the dummy gates 76 and the dummy dielectric layers 60 are removed by an aniso-tropic dry etch process. For example, the etching process may include a dry etch process using reaction gas(es) that selectively etch the dummy gates 76 at a faster rate than the first ILD 96 or the first spacers 81. Each second recess 98 exposes and/or overlies portions of nanostructures 55, which act as channel regions in subsequently completed nano-FETs. Portions of the nanostructures 55 which act as the channel regions are disposed between neighboring pairs of the epitaxial source/drain regions 92. During the removal, the dummy dielectric layers 60 may be used as etch stop layers when the dummy gates 76 are etched. The dummy dielectric layers 60 may then be removed after the removal of the dummy gates 76.

Figure 24A:
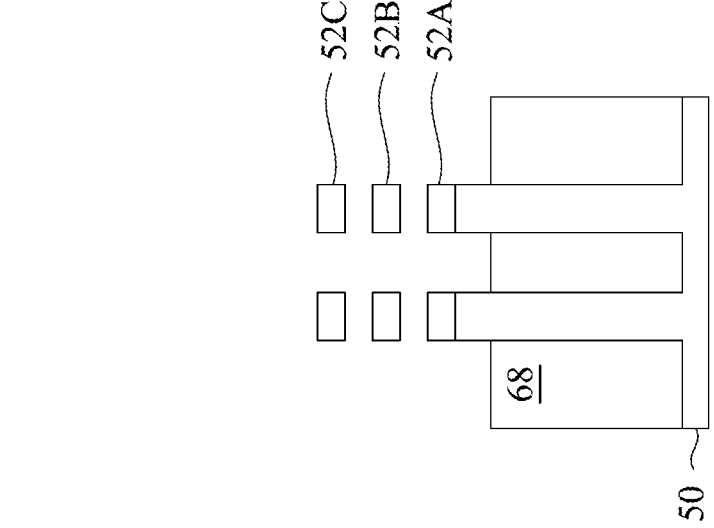
Figure 24A:
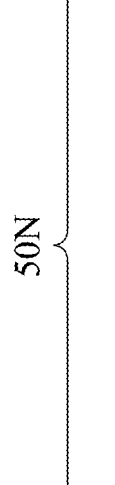
Figure 24A:
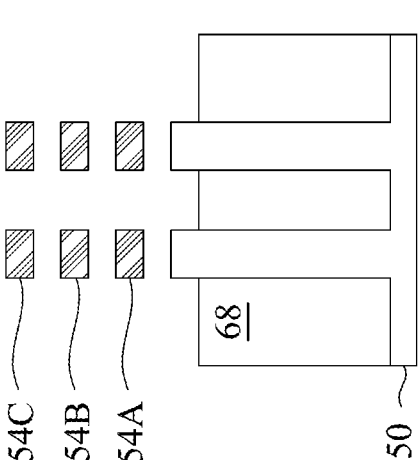
Figure 24B:
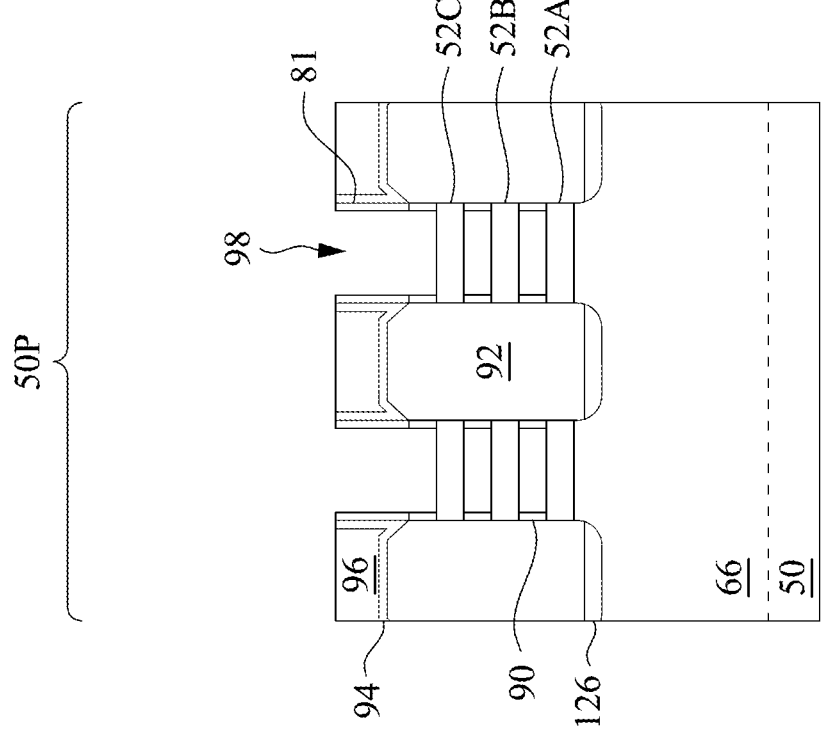
Figure 24B:
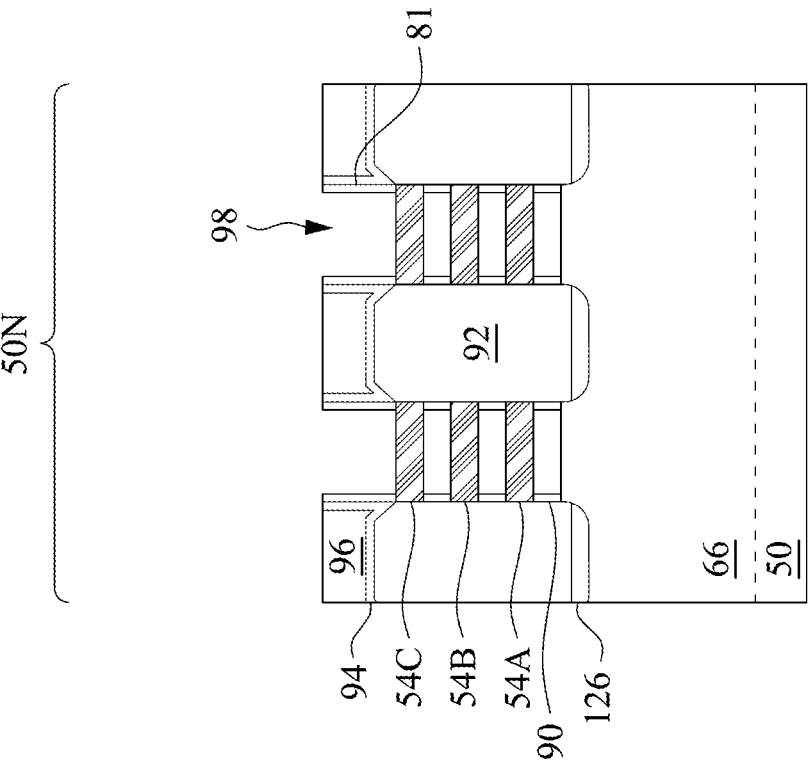

In FIGS. 24A and 24B, the first nanostructures 52 in the n-type region 50N and the second nanostructures 54 in the p-type region 50P are removed extending the second recesses 98. The first nanostructures 52 may be removed by forming a mask (not shown) over the p-type region 50P and performing an isotropic etching process such as wet etching or the like using etchants which are selective to the materials of the first nanostructures 52, while the second nanostructures 54, the substrate 50, the STI regions 68 remain relatively unetched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide ($NH_4OH$), or the like may be used to remove the first nanostructures 52 in the n-type region 50N.

The second nanostructures 54 in the p-type region 50P may be removed by forming a mask (not shown) over the n-type region 50N and performing an isotropic etching process such as wet etching or the like using etchants which are selective to the materials of the second nanostructures 54, while the first nanostructures 52, the substrate 50, the STI regions 68 remain relatively unetched as compared to the second nanostructures 54. In embodiments in which the second nanostructures 54 include, e.g., SiGe, and the first nanostructures 52 include, e.g., Si or SiC, hydrogen fluoride, another fluorine-based etchant, or the like may be used to remove the second nanostructures 54 in the p-type region 50P.

In other embodiments, the channel regions in the n-type region 50N and the p-type region 50P may be formed simultaneously, for example by removing the first nano-structures 52 in both the n-type region 50N and the p-type region 50P or by removing the second nanostructures 54 in both the n-type region 50N and the p-type region 50P. In such embodiments, channel regions of n-type nano-FETs and p-type nano-FETS may have a same material compo-sition, such as silicon, silicon germanium, or the like. FIGS. 29A, 29B, and 29C illustrate a structure resulting from such embodiments where the channel regions in both the p-type region 50P and the n-type region 50N are provided by the second nanostructures 54 and comprise silicon, for example.

Figure 25A:
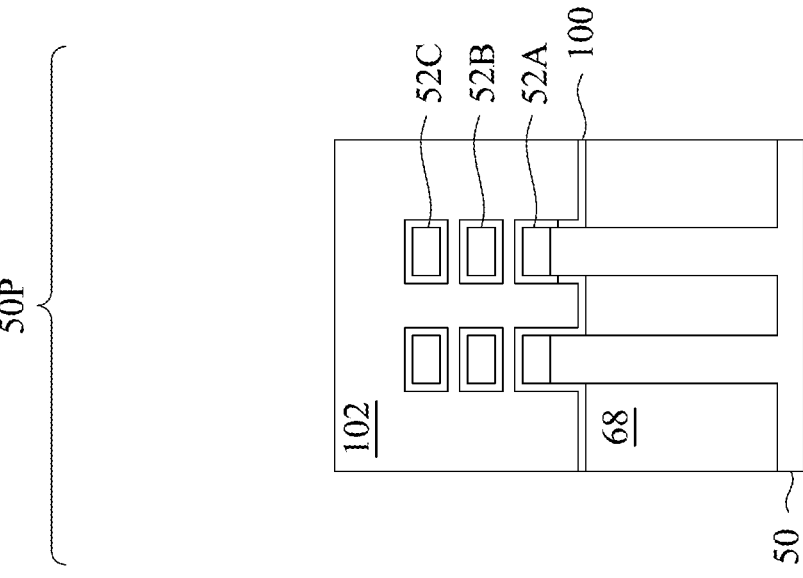
Figure 25A:
Figure 25A:
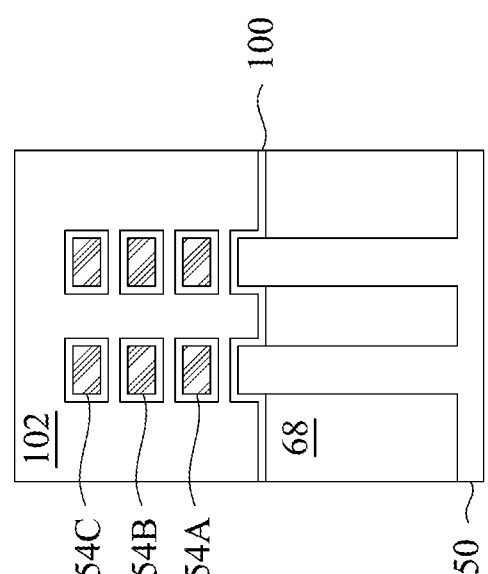
Figure 25B:
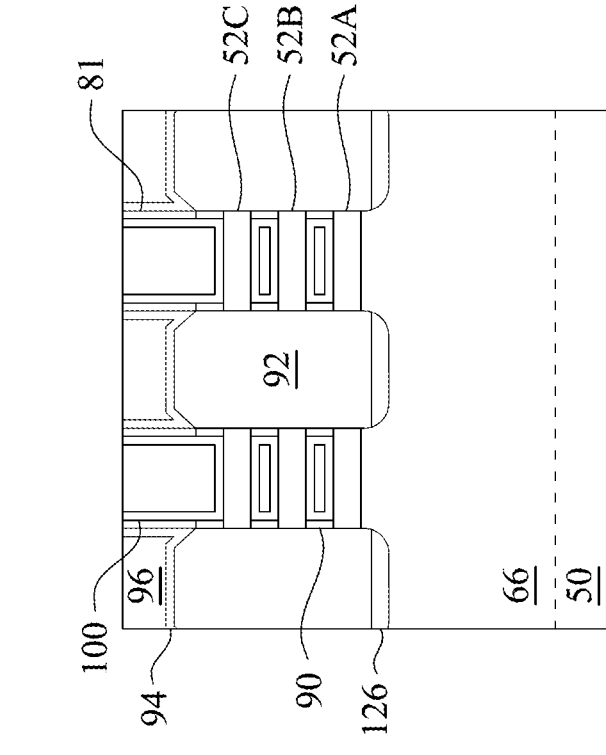
Figure 25B:
Figure 25B:
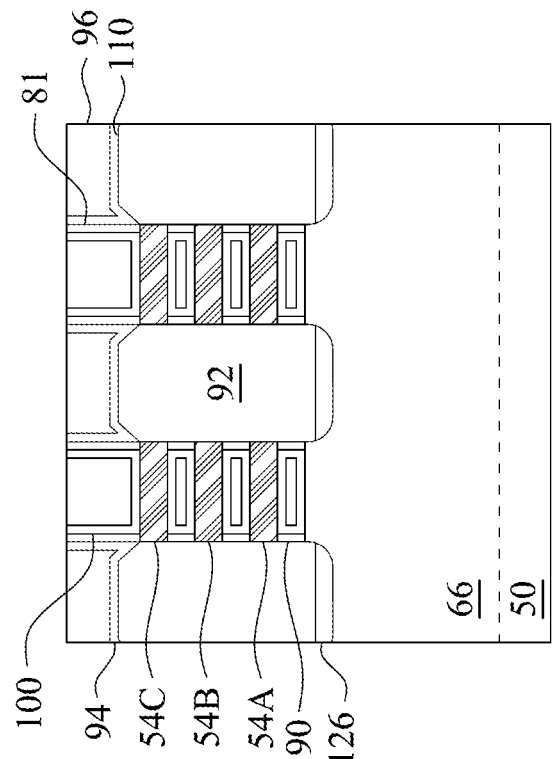

In FIGS. 25A and 25B, gate dielectric layers 100 and gate electrodes 102 are formed for replacement gates. The gate dielectric layers 100 are deposited conformally in the second recesses 98. In the n-type region 50N, the gate dielectric layers 100 may be formed on top surfaces and sidewalls of the substrate 50 and on top surfaces, sidewalls, and bottom surfaces of the second nanostructures 54, and in the p-type region 50P, the gate dielectric layers 100 may be formed on top surfaces and sidewalls of the substrate 50 and on top surfaces, sidewalls, and bottom surfaces of the first nano-structures 52. The gate dielectric layers 100 may also be deposited on top surfaces of the first ILD 96, the CESL 94, the first spacers 81, and the STI regions 68.

In accordance with some embodiments, the gate dielectric layers 100 comprise one or more dielectric layers, such as an oxide, a metal oxide, the like, or combinations thereof. For example, in some embodiments, the gate dielectric layers 100 may comprise a silicon oxide layer and a metal oxide layer over the silicon oxide layer. In some embodiments, the gate dielectric layers 100 include a high-k dielectric mate-rial, and in these embodiments, the gate dielectric layers 100 may have a k value greater than about 7.0, and may include a metal oxide or a silicate of hafnium, aluminum, zirconium, lanthanum, manganese, barium, titanium, lead, and combi-nations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the second recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 25A and 25B, the gate electrodes 102 may comprise any number of liner layers, any number of work function tuning layers, and a fill material. Any combination of the layers which make up the gate electrodes 102 may be deposited in the n-type region 50N between adjacent ones of the second nanostructures 54 and between the second nanostructure 54A and the substrate 50, and may be deposited in the p-type region 50P between adjacent ones of the first nanostructures 52.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the second recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

Figure 26A:
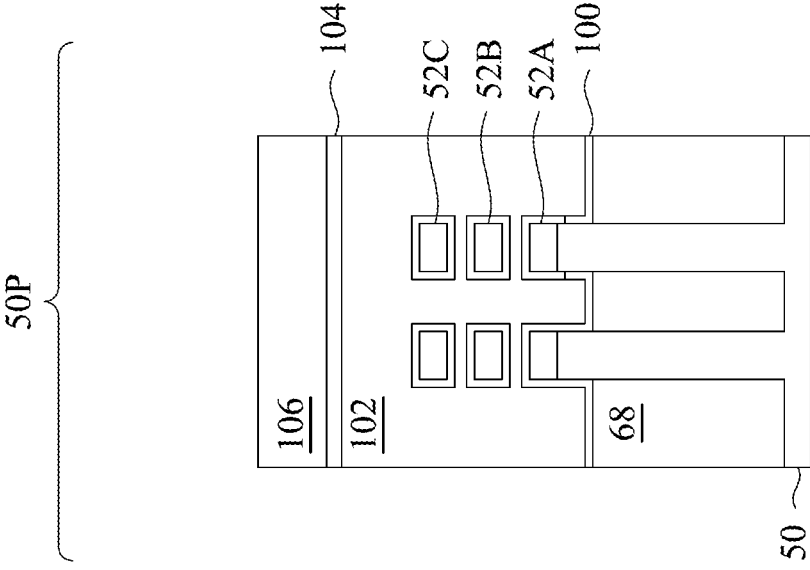
Figure 26A:
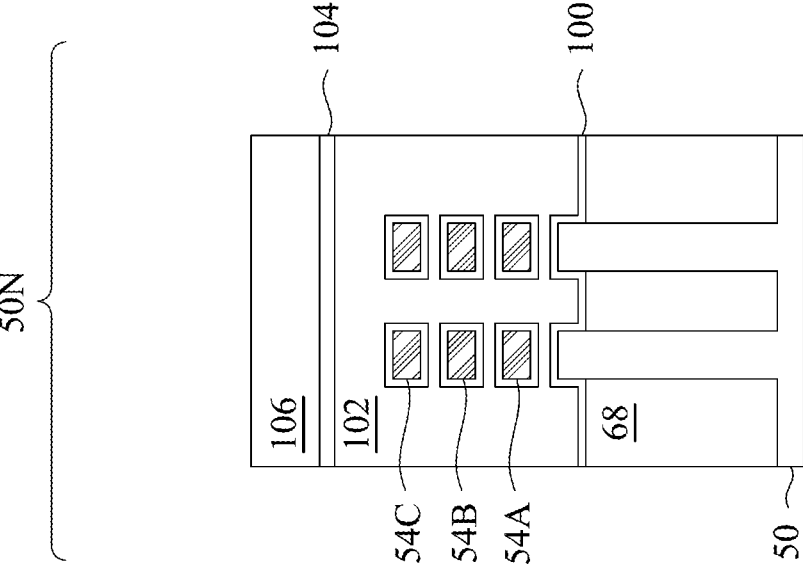
Figure 26B:
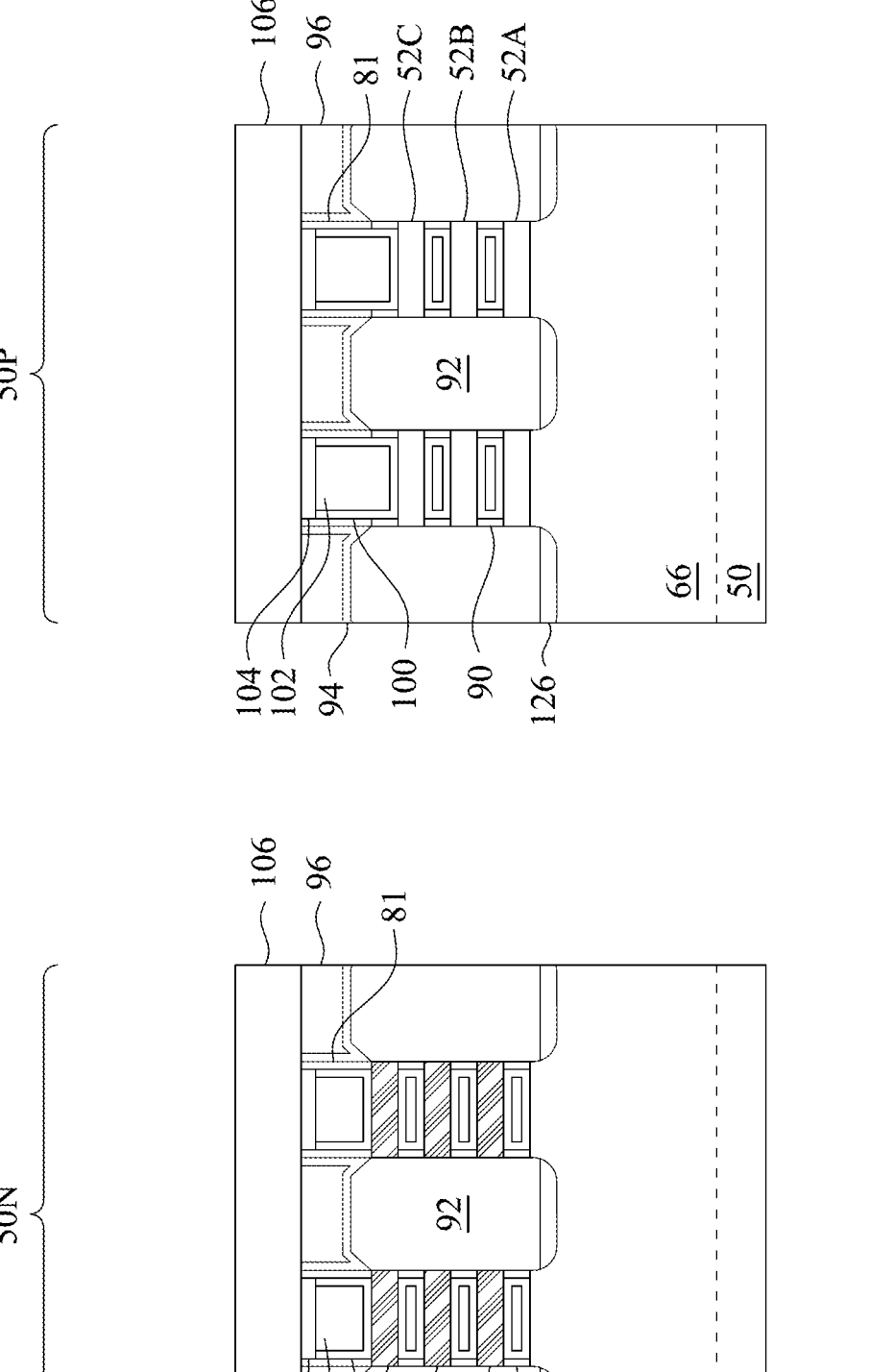
Figure 26C:
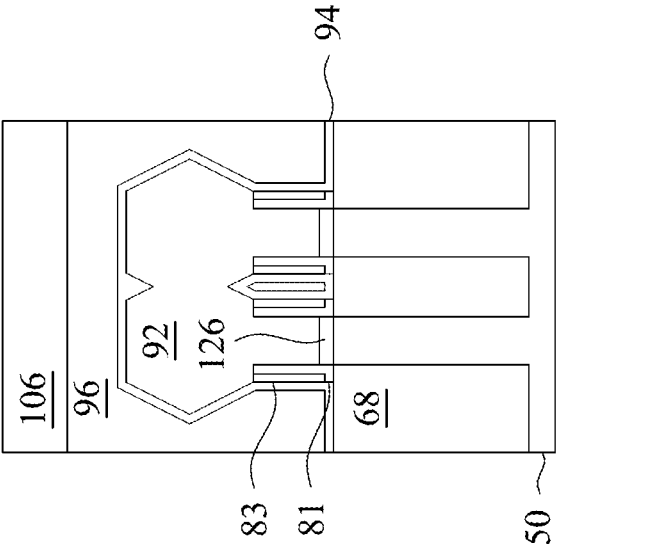

In FIGS. 26A-26C, the gate structure (including the gate dielectric layers 100 and the corresponding overlying gate electrodes 102) is recessed, so that a recess is formed directly over the gate structure and between opposing portions of first spacers 81. A gate mask 104 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the gate contacts 114, discussed below with respect to FIGS. 28A and 28B) penetrate through the gate mask 104 to contact the top surface of the recessed gate electrodes 102.

As further illustrated by FIGS. 26A-26C, a second ILD 106 is deposited over the first ILD 96 and over the gate mask 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 27A:
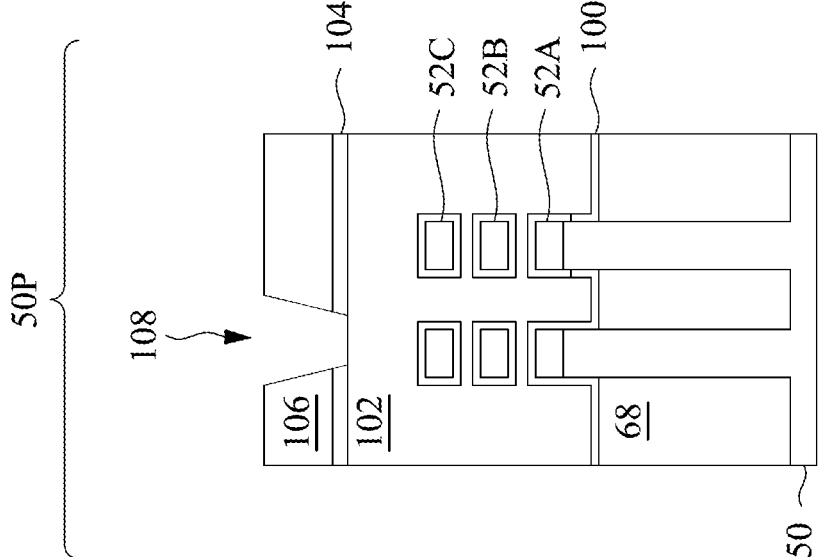
Figure 27A:
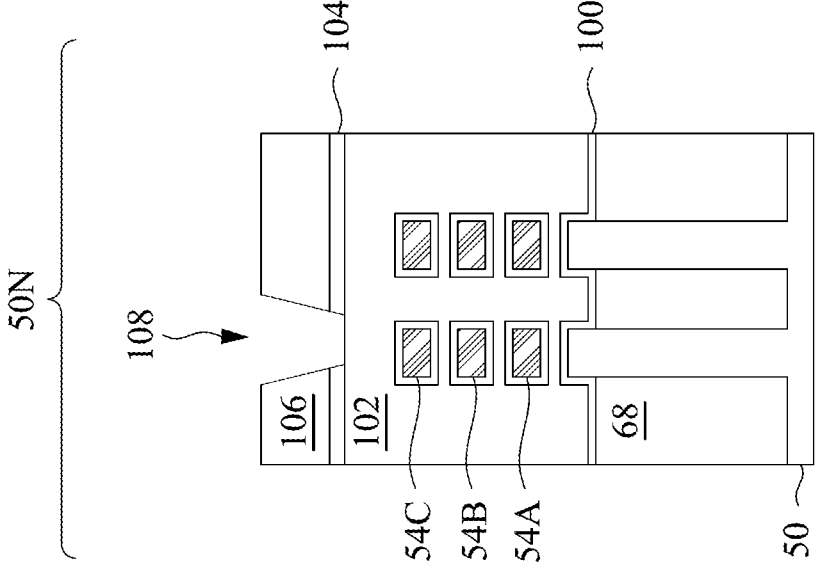
Figure 27B:
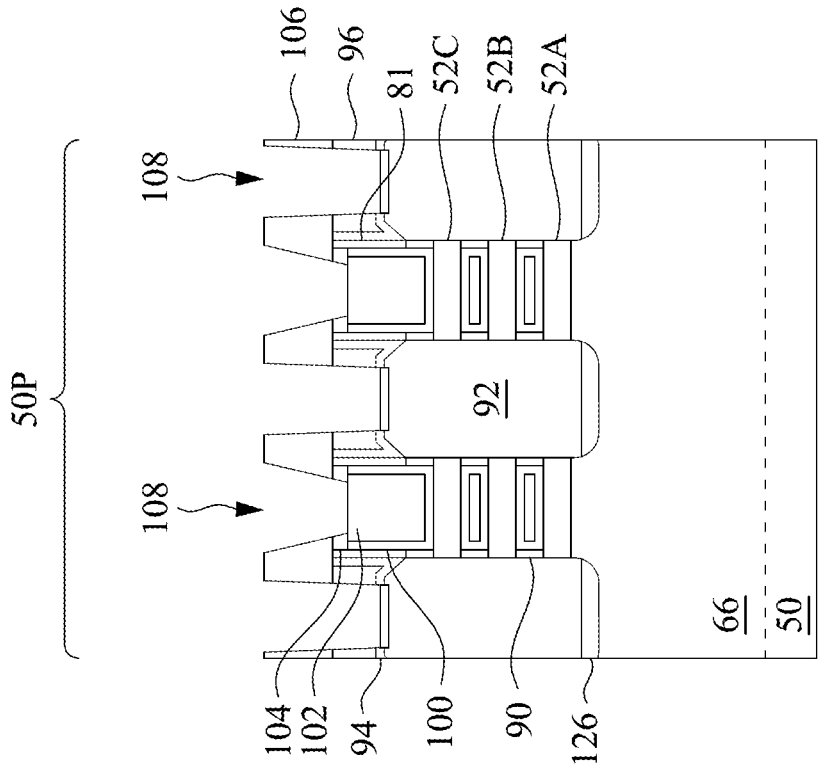
Figure 27B:
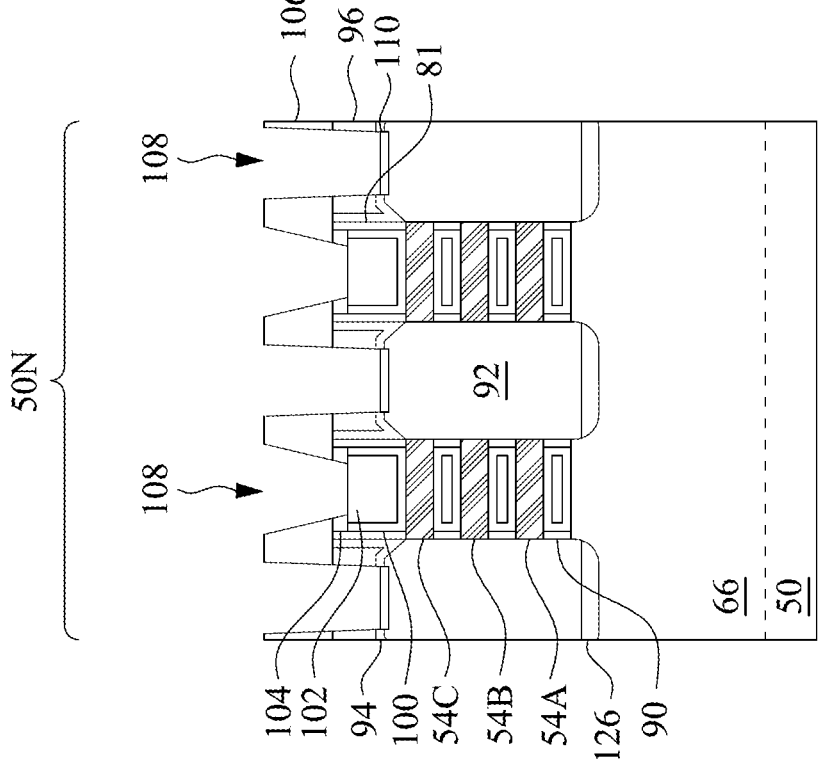
Figure 27C:
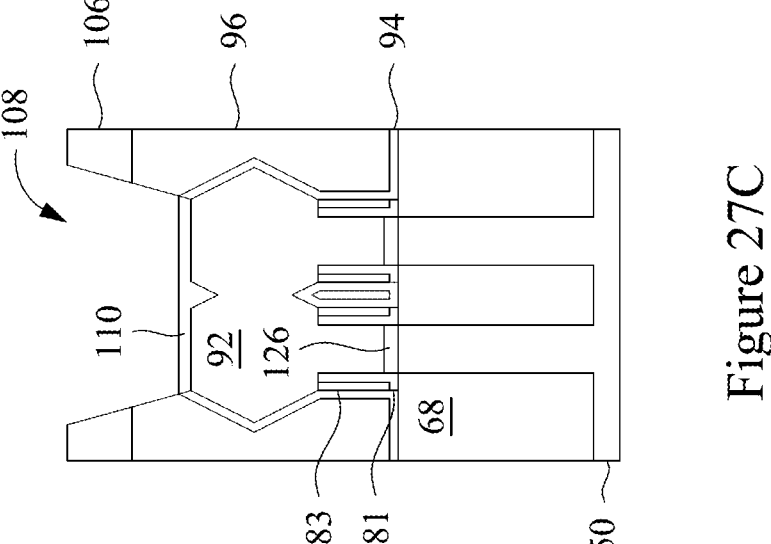

In FIGS. 27A-27C, the second ILD 106, the first ILD 96, the CESL 94, and the gate masks 104 are etched to form third recesses 108 exposing surfaces of the epitaxial source/drain regions 92 and/or the gate structure. The third recesses 108 may be formed by etching using an anisotropic etching process, such as RIE, NBE, or the like. In some embodiments, the third recesses 108 may be etched through the second ILD 106 and the first ILD 96 using a first etching process; may be etched through the gate masks 104 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the third recesses 108 extend into the epitaxial source/drain regions 92 and/or the gate structure, and a bottom of the third recesses 108 may be level with (e.g., at a same level, or having a same distance from the substrate), or lower than (e.g., closer to the gate dielectrics 50) the epitaxial source/drain regions 92 and/or the gate structure. Although FIG. 27B illustrate the third recesses 108 as exposing the epitaxial source/drain regions 92 and the gate structure in a same cross section, in various embodiments, the epitaxial source/drain regions 92 and the gate structure may be exposed in different cross-sections, thereby reducing the risk of shorting subsequently formed contacts. After the third recesses 108 are formed, silicide regions 110 are formed over the epitaxial source/drain regions 92. In some embodiments, the silicide regions 110 are formed by first depositing a metal (not shown) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 110. The un-reacted portions of the deposited metal are then removed, e.g., by an etching process. Although silicide regions 110 are referred to as silicide regions, silicide regions 110 may also be germanide regions, or silicon germanide regions (e.g., regions comprising silicide and germanide). In an embodiment, the silicide region 110 comprises TiSi, and has a thickness in a range between about 2 nm and about 10 nm.

Figure 28A:
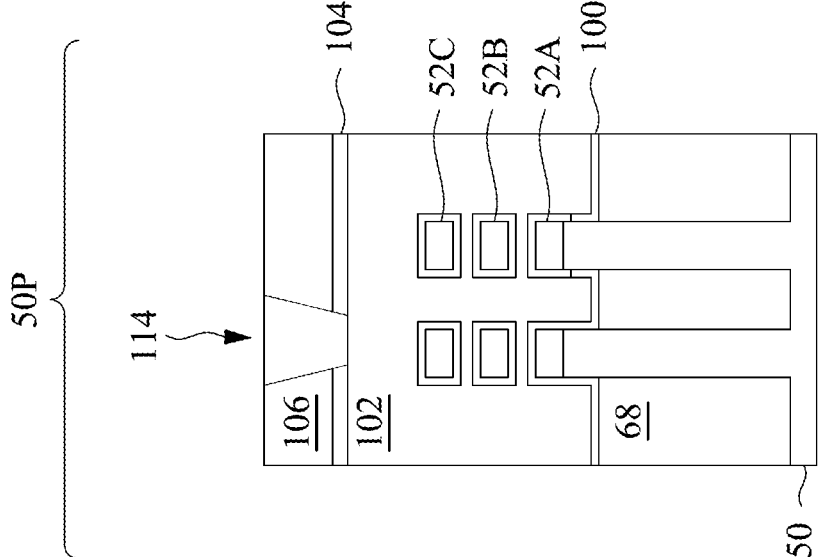
Figure 28A:
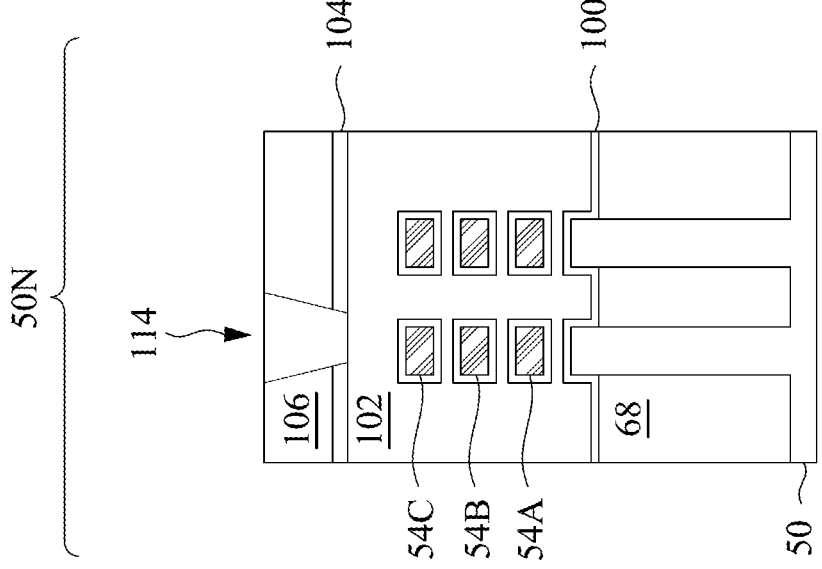
Figure 28B:
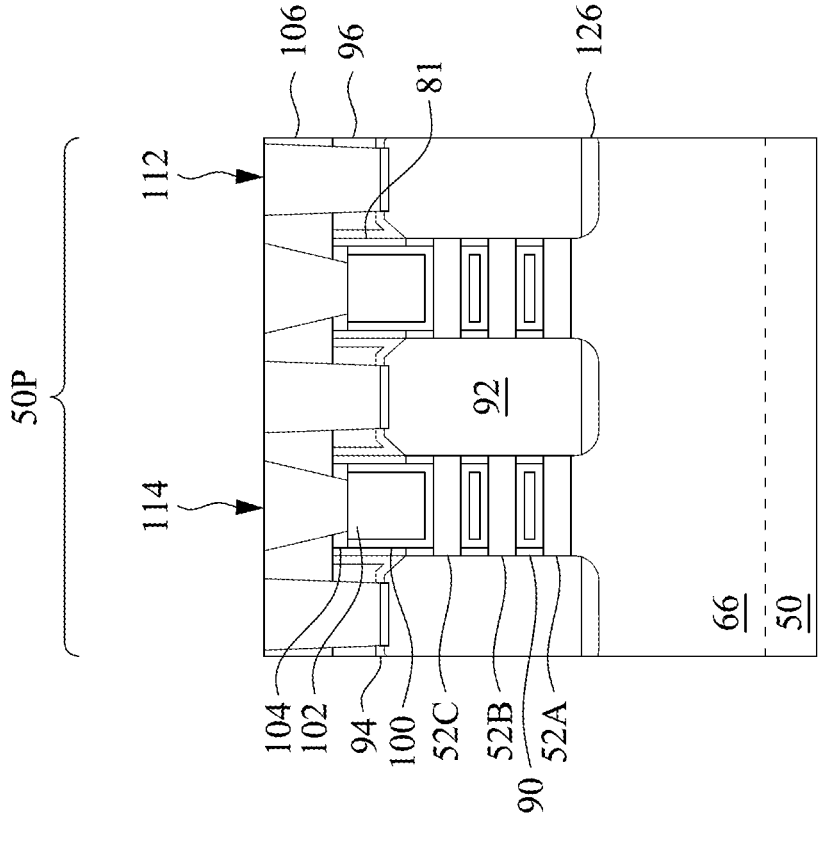
Figure 28B:
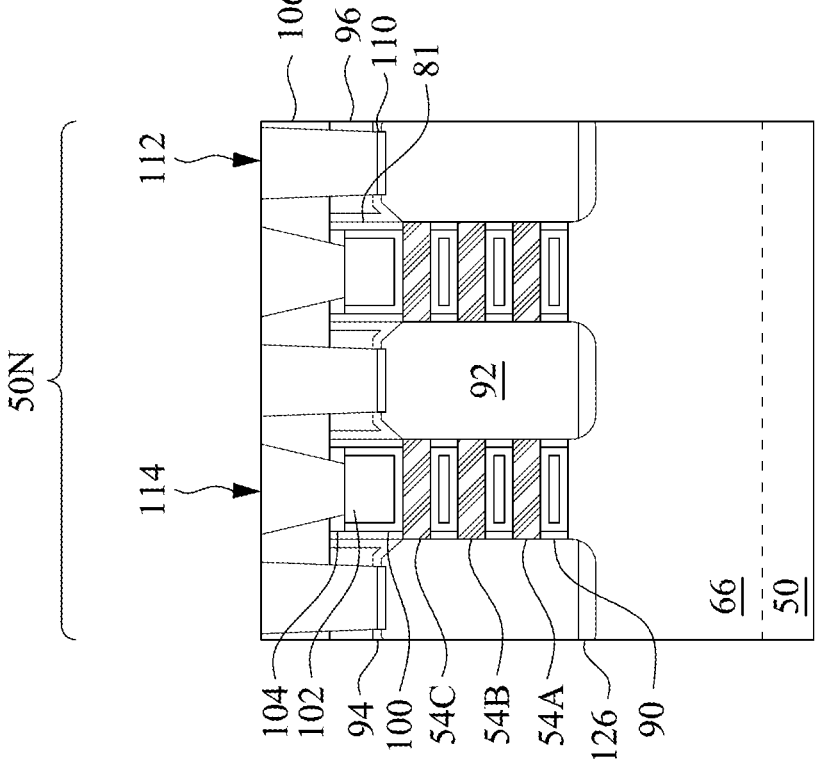
Figure 28C:
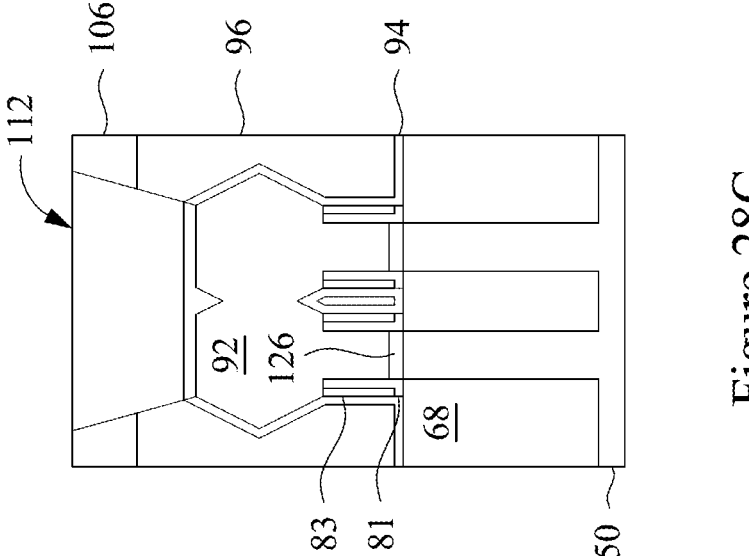

Next, in FIGS. 28A-28C, contacts 112 and 114 (may also be referred to as contact plugs) are formed in the third recesses 108. The contacts 112 and 114 may each comprise one or more layers, such as barrier layers, diffusion layers, and fill materials. For example, in some embodiments, the contacts 112 and 114 each include a barrier layer and a conductive material and is electrically coupled to the underlying conductive feature (e.g., gate electrode 102 and/or silicide region 110 in the illustrated embodiment). The contacts 114 are electrically coupled to the gate electrode 102 and may be referred to as gate contacts, and the contacts 112 are electrically coupled to the silicide regions 110 and may be referred to as source/drain contacts. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 106.

FIGS. 29A-29C illustrate cross-sectional views of a device according to some alternative embodiments. FIG. 29A illustrates reference cross-section A-A' illustrated in FIG. 7. FIG. 29B illustrates reference cross-section B-B' illustrated in FIG. 7. FIG. 29C illustrates reference cross-section C-C' illustrated in FIG. 7. In FIGS. 29A-29C, like reference numerals indicate like elements formed by like processes as the structure of FIGS. 28A-28C. However, in FIGS. 29A-29C, channel regions in the n-type region 50N and the p-type region 50P comprise a same material. For example, the second nanostructures 54, which comprise silicon, provide channel regions for p-type nano-FETs in the p-type region 50P and for n-type nano-FETs in the n-type region 50N. The structure of FIGS. 29A-29C may be formed, for example, by removing the first nanostructures 52 from both the p-type region 50P and the n-type region 50N simultaneously; depositing the gate dielectric layers 100 and the gate electrodes 102P (e.g., gate electrode suitable for a p-type nano-FET) around the second nanostructures 54 in the p-type region 50P; and depositing the gate dielectric layers 100 and the gate electrodes 102N (e.g., a gate electrode suitable for a n-type nano-FET) around the second nanostructures 54 in the n-type region 50N. In such embodiments, materials of the epitaxial source/drain regions 92 may be different in the n-type region 50N compared to the p-type region 50P as explained above.

Embodiments may achieve advantages. The techniques described herein allow for improved bottom-up deposition within recesses, including recesses having a large aspect ratio. Depositing a metallic or conductive material near the top of a recess as described herein can redirect the precursor plasma of a plasma-assisted deposition farther into the recess. By converging the plasma into the recess, the precursor plasma can more easily reach reaction sites near the bottom of the recess. In this manner, the deposited material can be formed more efficiently, more uniformly, and with reduced chance of seams or voids. Reducing the chance of seams or voids can reduce the chance of leakage, failure, shorting, or other defects, and can reduce the formation of defects within overlying materials. Additionally, the techniques described herein allow for more reliable deposition (e.g., gap-filling) of material within narrow recesses, which can allow for smaller feature sizes to be formed without reducing yield.

In an embodiment, a method includes depositing a first material on a sidewall surface of a recess in a substrate, wherein the first material is a conductive material; after depositing the first material, depositing a second material on a bottom surface of the recess using a plasma-assisted deposition process; and after depositing the second material, removing the first material. In an embodiment, the method includes depositing the first material on a top surface of the substrate that is adjacent the recess. In an embodiment, the bottom surface of the recess is free of the first material. In an embodiment, the method includes performing an etching process that removes portions of the first material within the recess. In an embodiment, the plasma-assisted deposition process is a Plasma-Enhanced Atomic Layer Deposition (PEALD) process. In an embodiment, the first material is titanium nitride. In an embodiment, the second material is free of seams or voids. In an embodiment, the plasma-assisted deposition process forms a positive electric charge on the first material.

In an embodiment, a method includes forming an opening in a substrate; and performing a deposition process to deposit a first material within the opening, the deposition process including depositing a second material within the opening; etching the second material to expose surfaces within the opening; introducing a first precursor of the first material into the opening; igniting a second precursor of the first material into a plasma, wherein the plasma is repelled by the second material; and introducing the plasma into the opening. In an embodiment, the opening has a width:height aspect ratio greater than 1:6. In an embodiment, the method includes removing the second material after performing the deposition process. In an embodiment, the method includes depositing the second material on a top surface of the substrate. In an embodiment, the second material is a metal. In an embodiment, depositing the second material includes a PVD process. In an embodiment, the second material has a thickness in the range of 1 nm to 10 nm. In an embodiment, the first material is a dielectric.

In an embodiment, a method includes forming a fin on a semiconductor substrate; forming a dummy gate structure on the fin; forming a recess in the fin adjacent the dummy gate structure; depositing a conductive material on the dummy gate structure; after depositing the conductive material, depositing a layer of dielectric material on a bottom surface of the recess using a plasma-assisted deposition process; forming a source/drain region on the layer of dielectric material; and after forming the source/drain region, removing the conductive material. In an embodiment, the dielectric material is silicon nitride. In an embodiment, removing the conductive material includes a chemical mechanical polish (CMP) process. In an embodiment, the method includes, before depositing the layer of dielectric material, performing an etching process to thin the conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

depositing a first material on a sidewall surface of a recess in a substrate, wherein the first material is a conductive material;

after depositing the first material, depositing a second material on a bottom surface of the recess using a plasma-assisted deposition process, wherein the plasma-assisted deposition process comprises:

igniting a precursor of the second material into a plasma; and directing the plasma into the recess, wherein the conductive material electrostatically repulses the plasma away from the sidewall surface; and after depositing the second material, removing the first material.

2. The method of claim 1 further comprising depositing the first material on a top surface of the substrate that is adjacent the recess.

3. The method of claim 1, wherein the bottom surface of the recess is free of the first material.

4. The method of claim 1 further comprising performing an etching process that removes portions of the first material within the recess.

5. The method of claim 1, wherein the plasma-assisted deposition process comprises a Plasma-Enhanced Atomic Layer Deposition (PEALD) process.

6. The method of claim 1, wherein the first material is titanium nitride.

7. The method of claim 1, wherein the second material is free of seams or voids.

8. The method of claim 1, wherein the plasma-assisted deposition process forms a positive electric charge on the first material.

9. A method comprising:

forming an opening in a substrate; and performing a deposition process comprising:

depositing a second material within the opening;

etching the second material to expose surfaces within the opening;

introducing a first precursor of a first material into the opening;

igniting a second precursor of the first material into a plasma, wherein the plasma is repelled away from the second material by the second material; and introducing the plasma into the opening, wherein the first material is deposited within the opening.

10. The method of claim 9, wherein the opening has a width: height aspect ratio greater than 1:6.

11. The method of claim 9 further comprising removing the second material after performing the deposition process.

12. The method of claim 9 further comprising depositing the second material on a top surface of the substrate.

13. The method of claim 9, wherein the second material is a metal.

14. The method of claim 9, wherein depositing the second material comprises a PVD process.

15. The method of claim 9, wherein the second material has a thickness in the range of 1 nm to 10 nm.

16. The method of claim 9, wherein the first material is a dielectric.

17. A method comprising:

forming a fin on a semiconductor substrate;

forming a dummy gate structure on the fin;

forming a recess in the fin adjacent the dummy gate structure;

depositing a conductive material on the dummy gate structure;

after depositing the conductive material, depositing a layer of dielectric material on a bottom surface of the recess using a plasma-assisted deposition process, wherein the plasma-assisted deposition process comprises a plasma of a precursor of the dielectric material, wherein the plasma-assisted deposition process positively charges the conductive material to deflect the plasma toward the bottom surface of the recess;

forming a source/drain region on the layer of dielectric material; and after forming the source/drain region, removing the conductive material.

18. The method of claim 17, wherein the dielectric material is silicon nitride.

19. The method of claim 17, wherein removing the conductive material comprises a chemical mechanical polish (CMP) process.

20. The method of claim 17 further comprising, before depositing the layer of dielectric material, performing an etching process to thin the conductive material.

* * * * *